(12) United States Patent
Mäkelä et al.

(10) Patent No.: US 11,499,227 B2
(45) Date of Patent: *Nov. 15, 2022

(54) VAPOR DEPOSITION OF THIN FILMS COMPRISING GOLD

(71) Applicant: ASM IP Holding B.V., Almere (NL)

(72) Inventors: Maarit Mäkelä, Helsinki (FI); Timo Hatanpää, Espoo (FI); Mikko Ritala, Espoo (FI); Markku Leskelä, Espoo (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/330,994

(22) Filed: May 26, 2021

(65) Prior Publication Data

US 2021/0277519 A1   Sep. 9, 2021

Related U.S. Application Data

(63) Continuation of application No. 16/178,199, filed on Nov. 1, 2018, now Pat. No. 11,047,046, which is a
(Continued)

(51) Int. Cl.
*C23C 16/06*     (2006.01)
*C23C 16/455*   (2006.01)
*C23C 16/18*     (2006.01)

(52) U.S. Cl.
CPC ........ *C23C 16/45553* (2013.01); *C23C 16/06* (2013.01); *C23C 16/18* (2013.01); *C23C 16/45527* (2013.01)

(58) Field of Classification Search
CPC ... C23C 16/06; C23C 16/18; C23C 16/45525; C23C 16/45527
See application file for complete search history.

(56) References Cited

U.S. PATENT DOCUMENTS 3,516,720 A * 6/1970 Mauer ................. C03C 17/3652
                                                                 351/44
5,063,096 A * 11/1991 Kohara ............... G02B 5/0833
                                                                 430/945
(Continued)

FOREIGN PATENT DOCUMENTS

CN    101182339      5/2008
JP    H07-62544       3/1995
(Continued)

OTHER PUBLICATIONS

Griffiths, Matthew B., et al., "Atomic Layer Deposition of Gold Metal". Chemistry of Materials, 2016, 28, 1, 44-46.*
(Continued)

*Primary Examiner* — Bret P Chen
(74) *Attorney, Agent, or Firm* — Knobbe, Martens, Olson & Bear LLP

(57) ABSTRACT

Vapor deposition processes for forming thin films comprising gold on a substrate in a reaction space are provided. The processes can be cyclical vapor deposition processes, such as atomic layer deposition (ALD) processes. The processes can include contacting the substrate with a gold precursor comprising at least one sulfur donor ligand and at least one alkyl ligand, and contacting the substrate with a second reactant comprising ozone. The deposited thin films comprising gold can be uniform, continuous, and conductive at very low thicknesses.

20 Claims, 18 Drawing Sheets

Related U.S. Application Data continuation of application No. 15/417,001, filed on Jan. 26, 2017, now Pat. No. 10,145,009.

(56) References Cited

U.S. PATENT DOCUMENTS

| | | | |
|---|---|---|---|
| 5,843,993 A | 12/1998 | Katti et al. | |
| 6,440,565 B1 * | 8/2002 | Kim | B82Y 30/00 428/411.1 |
| 6,610,467 B2 | 8/2003 | Asami et al. | |
| 10,145,009 B2 * | 12/2018 | Mäkelä | C23C 16/45553 |
| 11,047,046 B2 * | 6/2021 | Mäkelä | C23C 16/06 |
| 2003/0165615 A1 | 9/2003 | Aaltonen et al. | |
| 2005/0145968 A1 * | 7/2005 | Goela | G02B 5/00 438/72 |
| 2005/0239272 A1 * | 10/2005 | Ruttkowski | B81C 1/00357 257/E21.582 |
| 2008/0182358 A1 | 7/2008 | Cowdery-Corvan et al. | |
| 2008/0296650 A1 | 12/2008 | Ahn et al. | |
| 2009/0311568 A1 | 12/2009 | Yamada | |
| 2010/0270166 A1 | 10/2010 | Palacin et al. | |
| 2010/0285994 A1 | 11/2010 | Hosomi et al. | |
| 2012/0019258 A1 | 1/2012 | Kaya | |
| 2012/0115714 A1 | 5/2012 | Arisawa et al. | |
| 2012/0259272 A1 | 10/2012 | Staack et al. | |
| 2012/0323008 A1 * | 12/2012 | Barry | C07F 1/00 206/524.1 |
| 2013/0022995 A1 * | 1/2013 | Park | B22F 1/17 977/773 |
| 2013/0164842 A1 | 6/2013 | Ujihara et al. | |
| 2014/0015548 A1 | 1/2014 | Naughton et al. | |
| 2014/0051878 A1 | 2/2014 | Sundermeyer et al. | |
| 2014/0055855 A1 | 2/2014 | Hasegawa et al. | |
| 2014/0376351 A1 | 12/2014 | Cheng et al. | |
| 2015/0266909 A1 | 9/2015 | Isab et al. | |
| 2016/0022235 A1 | 1/2016 | Ning et al. | |
| 2016/0326187 A1 | 11/2016 | Altaf et al. | |
| 2017/0305942 A1 | 10/2017 | Al-Jaroudi et al. | |
| 2020/0018717 A1 | 1/2020 | Liu et al. | |

FOREIGN PATENT DOCUMENTS

| | | |
|---|---|---|
| JP | 2001-75214 | 3/2001 |
| JP | 2001-240981 | 9/2001 |
| JP | 2018-143978 | 9/2018 |
| KR | 10-2014-0078534 | 6/2014 |
| TW | 292435 | 12/1996 |
| TW | 201100582 | 1/2011 |
| WO | WO 2009086263 A1 | 7/2009 |
| WO | WO 2012/155264 | 11/2012 |

OTHER PUBLICATIONS

Makela, Maarit, et al., " Potential gold(I) precursors evaluated for atomic layer deposition". Journal of Vacuum Science & Technology A 35(1), 01B112 (2017) pp. 1-9.*

Liu, Pengfei, et al., "Thermal Atomic Layer Deposition of Gold: Mechanistic Insights, Nucleation, and Epitaxy". ACS Applied Materials & Interfaces 2021, 13, 9091-9100.*

Makela, Maarit, et al., "Thermal atomic layer deposition (ALD) of continuous and highly conducting gold thin films". Chemistry of Materials 29(14), 6130-6136.*

Goss, Charles A., et al., "Application of (3-Mercaptopropyl)trimethoxysilane as a Molecular Adhesive in the Fabrication of Vapor-Deposited Gold Electrodes on Glass Substrates". Analytical Chemistry, vol. 63, No. 1, Jan. 1, 1991, pp. 85-88.*

Herrasti, P., et al., "Scanning-tunneling-microscopy study on the growth mode of vapor-deposited gold films". Physical Review A, vol. 45, No. 10, May 15, 1992, pp. 7440-7451.*

Lloyd, J.R., et al., "Voids in thin as-deposited gold films prepared by vapor deposition". Journal of Vacuum Science and Technology 14, 655 (1977), 2 pages. Abstract Only.*

Baum et al., "Laser chemical vapor deposition of gold", Appl. Phys. Lett. 47, 538, (1985), 2 pages. Abstract Only.

Boom, et al., "Gold(I) Complexes of the Geminal Phosphinoborane tBu2PCH2BPh2", ACS Omega 2018, 3, pp. 3945-3951.

Cheng et al., "Vapor Deposited Thin Gold Coatings for High Temperature Electrical Contacts", Electrical Contacts—1996. Proceedings of the Forty-Second IEEE Holm Conference on Electrical Contacts. Joint with the 18$^{th}$ International Conference on Electrical Contacts, Chicago, IL, USA, 1996, pp. 401-441.

Feng et al., "Thin Film Technology and Application", Northwestern Polytechnical University Press, Feb. 2016, pp. 177, 1-25.

Gimeno et al., "Gold Chemistry with Ferrocene Derivatives as Ligands", Gold Bulletin, 1999, 32(3), pp. 90-95.

Griffiths et al., "Atomic Layer Deposition of Gold Metal, Chemistry of Materials", pp. 44-46, 2016.

Hollatz et al., "Neutral Gold(I) Complexes with Mixed Phosphorus Ligands", Chem. Ber./Recueil, 1997, 130, pp. 1333-1339.

International Search Report and Written Opinion for International Application No. PCT/US2018/013079, Notification dated Mar. 9, 2018.

Kal et al., Stress and resistivity analysis of electrodeposited gold films for MEMS application, Microelectronics Journal 37, pp. 1329-1344, 2006.

Larsen et al., "Chemical Vapor Deposition of Gold", Abstract 1 page. Citation and date unavailable.

Mäkelä et al., "Potential Gold(I) Precursors Evaluated for Atomic Layer Deposition", Journal of Vacuum Science & Technology A—Vacuum, Surfaces, and Films, vol. 35, No. 1, Jan./Feb. 2017, pp. 01B112-1-01B112-9.

Mäkelä et al., "Thermal Atomic Layer Deposition of Continuous and Highly Conducting Gold Thin Films", American Chemical Society, Chemistry of Materials, vol. 29, 2017, pp. 6130-6136.

Mäkelä, Maarit, "Studies on Atomic Layer Deposition of Gold and Silver Thin Films", Academic Dissertation, Department of Chemistry, University of Helsinki, Helsinki, Finland, 2018, pp. 1=91.

Mikhlin et al., "Formation of gold and gold sulfide nanoparticles and mesoscale intermediate structures in the reactions of aqueous HauCl4 with sulfide and citrate ions", Phys. Chem. Chem. Phys., 2009, 11, pp. 5445-5454.

Miyake et al., "Electroless deposition of gold thin films on silicon for surface-enhanced infrared spectroelectrochemistry", Electrochemistry Communications 4 (2002) 973-977.

Okimura et al., "Chemical vapor deposition of gold Al2O3, SiO2, and TiO2 for oxidation of CO and of H2", Catalysis Letters, 51, 53-58 (1998).

Turgambaeva et al., "A Comparative Study of Series of Dimethylgold(III) Complexes with S,S Chelating Ligands Used as MOCVD Precursors", Physics Procedia, vol. 46, 2013, pp. 167-173.

Yuan et al., "Sustainable scalable synthesis of sulfide nanocrystals at low cost with an ionic liquid sulfur precursor", Nature Communications, 2018, 9:4078 | DOI: 10.1038/s41467-018-06549-8.

Zharkova et al., Synthesis, Properties, and Structure of Dimethylgold(III) Complexes [(CH$_3$)$_2$AuI]$_2$ and (CH$_3$)$_2$AuS$_2$CN(C$_2$H$_5$)$_2$, Journal of Structural Chemistry. vol. 48, No. 1, pp. 108-113, 2007.

* cited by examiner

VAPOR DEPOSITION OF THIN FILMS COMPRISING GOLD

REFERENCE TO RELATED APPLICATIONS

The present application is a continuation of U.S. application Ser. No. 16/178,199, filed Nov. 1, 2018, now U.S. Pat. No. 11,047,046, which is a continuation of U.S. application Ser. No. 15/417,001, filed Jan. 26, 2017, now U.S. Pat. No. 10,145,009, which is hereby incorporated by reference in its entirety.

PARTIES OF JOINT RESEARCH AGREEMENT

The invention claimed herein was made by, or on behalf of, and/or in connection with a joint research agreement between the University of Helsinki and ASM Microchemistry Oy. The agreement was in effect on and before the date the claimed invention was made, and the claimed invention was made as a result of activities undertaken within the scope of the agreement.

BACKGROUND OF THE INVENTION

Field of the Invention

The present disclosure relates generally to the field of vapor phase deposition, particularly cyclical vapor deposition of thin films comprising gold.

Description of the Related Art

Thin films comprising gold have desirable electronic and plasmonic properties for a variety of applications in a variety of fields, including photonics, MEMS devices, electronic components, electrochromic devices, photovoltaics, photocatalysis, and more. However, reliable deposition of thin films comprising gold by cyclical vapor deposition processes has proven difficult, particularly with respect to deposition of continuous and conducting thin films comprising gold.

SUMMARY OF THE INVENTION

According to some embodiments processes for forming thin films comprising gold on a substrate in a reaction space are provided herein. In some embodiments the process may comprise alternately and sequentially contacting the substrate with a vapor phase gold precursor and a vapor phase second reactant, wherein the vapor phase gold precursor comprises at least one ligand comprising sulfur or selenium, and at least one alkyl ligand, and wherein the gold precursor and the second reactant react to thereby form the thin film comprising gold.

In some embodiments alternately and sequentially contacting the substrate with a vapor phase gold precursor and a vapor phase second reactant may comprise a deposition cycle that is repeated two or more times. In some embodiments, the deposition cycle may further comprise removing excess vapor phase gold precursor and reaction byproducts, if any, from the reaction space after contacting the substrate with the vapor phase gold precursor. In some embodiments, the deposition cycle may further comprise removing excess second reactant and reaction byproducts, if any, from the reaction space after contacting the substrate with the second reactant.

According to some embodiments the gold of the gold precursor has an oxidation state of +III. In some embodiments, the ligand comprising sulfur or selenium comprises sulfur. In some embodiments, the ligand comprising sulfur or selenium comprises selenium. In some embodiments, the gold precursor comprises one or more additional neutral adducts. In some embodiments, the gold precursor comprises a diethyldithiocarbamato ligand. In some embodiments, the gold precursor comprises $Me_2Au(S_2CNEt_2)$. In some embodiments, the second reactant comprises oxygen. In some embodiments, the second reactant comprises a reactive species of oxygen. In some embodiments, the second reactant comprises ozone.

According to some embodiments, the process has a deposition temperature of from about 120° C. to about 220° C. In some embodiments, the thin film comprising gold is continuous when it reaches a thickness of about 20 nm. In some embodiments, the thin film comprising gold has a thickness of from about 20 nm to about 50 nm. In some embodiments, the thin film comprising gold has a resistivity of less than about 20 $\mu\Omega cm$. In some embodiments, the thin film comprising gold has a growth rate of more than about 0.8 Å per deposition cycle. In some embodiments, the process is an atomic layer deposition (ALD) process. In some embodiments, the process is a cyclical chemical vapor deposition (CVD) process.

According to some embodiments atomic layer deposition (ALD) processes for forming thin films comprising gold on a substrate in a reaction space are provided. In some embodiments the process may comprise a plurality of deposition cycles, wherein at least one deposition cycle comprises alternately and sequentially contacting the substrate with a vapor phase gold precursor and a vapor phase second reactant, wherein the deposition cycle is repeated two or more times to form the thin film comprising gold, wherein the gold of the vapor phase gold precursor has an oxidation state of +III and the vapor phase gold precursor comprises at least one sulfur donor ligand and at least one alkyl ligand.

According to some embodiments, the gold precursor comprises $Me_2Au(S_2CNEt_2)$. In some embodiments, the second reactant comprises ozone. In some embodiments, the thin film comprising gold is continuous when it reaches a thickness of about 20 nm. In some embodiments, the thin film comprising gold is continuous after 100 deposition cycles.

BRIEF DESCRIPTION OF THE DRAWINGS

The invention will be better understood from the Detailed Description and from the appended drawings, which are meant to illustrate and not to limit the invention, and wherein.

DETAILED DESCRIPTION OF THE PREFERRED EMBODIMENT

Figure 1:
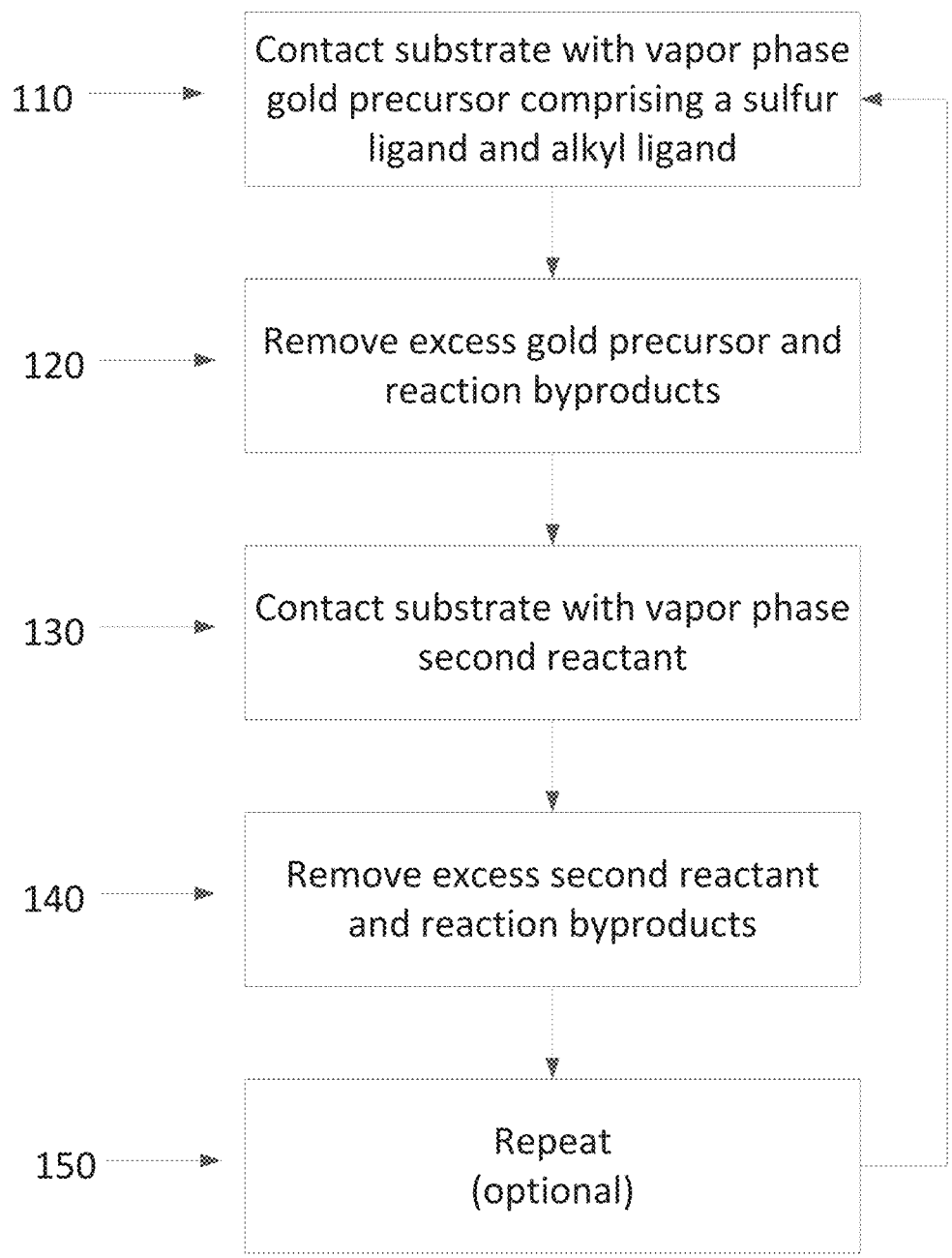
FIG. 1 is a process flow diagram generally illustrating a cyclical vapor deposition process for depositing thin films comprising gold.

Thin films comprising gold, particularly continuous metallic gold thin films deposited according to some embodiments as described herein, have a wide variety of potential applications. For example, in the field of plasmonic sensing, thin films comprising gold deposited by some embodiments as described herein may be useful in surface-enhanced Raman spectroscopy (SERS). The unique plasmonic properties of thin films comprising gold make such films highly desirable for many next-generation electronic and photonic devices. Gold is also a highly efficient conductor and can carry very small currents while remaining relatively free of corrosion as compared to other metallic thin films. Therefore, thin films comprising gold deposited by some embodiments as described herein may be useful in a variety of electronic component and device applications, including, for example, nanofabricated semiconductor devices.

Continuous and conducting thin films comprising gold deposited by some embodiments as described herein may also have applications in microelectromechanical systems (MEMS) devices, such as radio-frequency (RF) MEMS devices, due to such films high electrical conductivity. RF MEMS devices including continuous and conducting thin films comprising gold deposited by some embodiments as described herein can operate at gigahertz frequencies, allowing for large bandwidth and extremely high signal-to-noise rations. Continuous thin films comprising gold deposited by some embodiments as described herein may also be useful in inertial MEMS to increase the mass of a proof-mass for achieving high sensitivity in accelerometers. Such thin films comprising gold can be used in variable capacitors, chemical and biological sensors, and optical detectors.

Thin films comprising gold deposited according to processes described herein may also be useful in electrochromic devices, photovoltaics, and photocatalysis, among other applications.

According to some embodiments thin films comprising gold and processes for forming thin films comprising gold are provided. In some embodiments, thin films comprising gold deposited according to the processes described herein may be metallic and may be continuous and conducting.

In some embodiments, thin films comprising gold are deposited on a substrate by vapor deposition processes. For example, in some embodiments a thin film comprising gold may be deposited by a deposition process utilizing surface-controlled reactions in which a gold precursor on the substrate reacts with an second reactant to form the film comprising gold, for example as in an atomic layer deposition type process. In some embodiments, the vapor deposition process may be a thermal deposition process. In some embodiments, the vapor deposition process may be a plasma deposition process. However, in some embodiments the vapor deposition process does not utilize plasma. In some embodiments, the deposition process may be a cyclical deposition process, for example an atomic layer deposition (ALD) process or a cyclical chemical vapor deposition (CVD) process. In some embodiments, a process for depositing a thin film comprising gold may comprise alternately and sequentially contacting a substrate with a first vapor phase gold reactant and a second reactant.

In some embodiments, the deposition process may utilize an organometallic gold precursor and a second reactant. In some embodiments, the gold of the organometallic gold precursor may have an oxidation state of +III. In some embodiments, the organometallic gold precursor may comprise sulfur. In some embodiments, the organometallic gold precursor comprises at least one ligand comprising sulfur and at least one alkyl ligand. For example, when a gold precursor is utilized in a process as described herein, and the said gold precursor does not comprise at least one ligand comprising sulfur and at least one alkyl ligand, such a process may not deposit a continuous film comprising gold, or will produce a continuous film only at high film thicknesses. It was thus unexpectedly found that utilizing a gold precursor comprising at least one ligand comprising sulfur and at least one alkyl ligand, such as a gold precursor comprising $Me_2Au(S_2CNEt_2)$, allows for deposition of a high quality thin films comprising gold at relatively low film thicknesses, for example a continuous gold thin film having a relatively low film thickness. In some embodiments, the organometallic gold precursor may comprise $Me_2Au(S_2CNEt_2)$. In some embodiments, the second reactant may comprise oxygen. In some embodiments, the second reactant may comprise a reactive form of oxygen, for example ozone. In some embodiments a process for depositing a thin film comprising gold may utilize a gold precursor comprising at least one ligand comprising sulfur, at least one alkyl ligand, wherein the oxidation state of the gold of the gold precursor is +III, and an second reactant comprising ozone.

In some embodiments, the deposited thin film may comprise gold. In some embodiments, a thin film comprising metallic gold may be deposited. In some embodiments, the deposited thin film comprising gold may comprise an amount of oxygen. In some embodiments, the deposited thin film comprising gold may be continuous. In some embodiments the deposited film comprising gold may be continuous at a thickness of less than about 50 nm, less than about 40 nm, less than about 30 nm, or less than about 20 nm or thinner. In some embodiments a continuous film comprising gold may be deposited by a deposition process comprising fewer than about 500 deposition cycles, fewer than about 400 deposition cycles, fewer than about 300 deposition cycles, fewer than about 200 deposition cycles, or fewer than about 100 deposition cycles or fewer.

In some embodiments, the deposited film comprising gold may be a conducting film. In some embodiments the deposited film comprising gold may have a resistivity of less than about 20 μΩcm, less than about 15 μΩcm, less than about 10 μΩcm, less than about 5 μΩcm or fewer.

Vapor Deposition of Thin Films Comprising Gold

In some embodiments, films comprising gold are deposited by an atomic layer deposition-type process. Atomic layer deposition (ALD) type processes are based on controlled, self-limiting surface reactions of precursor chemicals, or reactants. Gas phase reactions are avoided by alternately and sequentially contacting the substrate with the precursors. Vapor phase reactants are separated from each other on the substrate surface, for example, by removing excess reactants and/or reactant byproducts from substrate surface of interest between reactant pulses. In some embodiments, one or more substrate surfaces are alternately and sequentially contacted with two or more vapor phase precursors, or reactants. Contacting a substrate surface with a vapor-phase reactant means that the reactant vapor is in contact with the substrate surface for a limited period of time. In other words, it can be understood that the substrate surface is exposed to each vapor phase reactant for a limited period of time.

Briefly, a substrate is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the precursors being used and is generally at or below about 700° C., in some embodiments the deposition temperature is generally at or above about 100° C. for vapor deposition processes, in some embodiments the deposition temperature is between about 100° C. and about 250° C., and in some embodiments the deposition temperature is between about 120° C. and about 200° C. In some embodiments, the deposition temperature is below about 500° C., below about 400° C. or below about 300° C. In some instances the deposition temperature can be below about 200° C., below about 150° C. or below about 100° C., for example, if additional reactants or reducing agents, such as reactants or reducing agents comprising hydrogen, are used in the process.

The surface of the substrate is contacted with a first vapor phase reactant or precursor. In some embodiments a pulse of vapor phase first reactant is provided to a reaction space containing the substrate (for example, in time divided ALD). In some embodiments the substrate is moved to a reaction space containing vapor phase first reactant (for example, in space divided ALD, also known as spatial ALD). Conditions can be selected such that no more than about one monolayer of the first reactant or a species thereof is adsorbed on the first surface of the substrate in a self-limiting manner. However, in some arrangements hybrid CVD/ALD, or cyclical CVD, processes can allow overlap of the different mutually reactive reactants over the substrate and thus can produce more than a monolayer per cycle. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

For ALD processes, in which overlap between the reactants is minimized or avoided, vapor phase precursors and/or vapor phase byproducts are removed from the substrate surface, such as by evacuating a chamber with a vacuum pump and/or by purging (for example, replacing the gas inside a reactor with an inert gas such as argon or nitrogen). Supply of the reactant to the substrate surface is typically stopped during the removal periods, and may be shunted to a different chamber or to a vacuum pump during the removal periods. Typical removal times are from about 0.05 to 20 seconds, from about 1 to 10 seconds, or from about 1 to 2 seconds. However, other removal times can be utilized if necessary, such as where highly conformal step coverage over extremely high aspect ratio structures or other structures with complex surface morphology is needed.

The surface of the substrate is contacted with a vapor phase second reactant or precursor. In some embodiments, a pulse of a second reactant is provided to a reaction space containing the substrate. In some embodiments, the substrate is moved to a reaction space containing the vapor phase second reactant. Excess second reactant and gaseous byproducts of the surface reaction, if any, are removed from the substrate surface. Contacting and removing are repeated until a thin film of the desired thickness has been formed on the substrate, with each cycle leaving no more than about a molecular monolayer in an ALD or ALD type process, or one or more molecular monolayers in a hybrid CVD/ALD, or cyclical CVD process. Additional phases comprising alternately and sequentially contacting the surface of a substrate with other reactants can be included to form more complicated materials, such as alloys comprising two or more metals, or composite materials comprising gold and some other compound or compounds.

As mentioned above, each phase of each cycle can be self-limiting for ALD processes. An excess of reactants is supplied in each phase to saturate the susceptible substrate surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen, argon or another inert gas. In some embodiments, purging can comprise turning off the flow of the reactive gas while continuing to flow an inert carrier gas to the reaction space. For example, in some embodiments an inert carrier gas may be flown continuously throughout the deposition process while the precursors or reactants may be intermittently supplied to the reaction space.

The substrate can comprise various types of materials. When manufacturing integrated circuits, the substrate typically comprises a number of thin films with varying chemical and physical properties. In some embodiments, the substrate may comprise silicon or silicon oxide, for example native oxide or thermal oxide. In some embodiments, the substrate may comprise glass. In some embodiments, the substrate may comprise one or more oxide materials, for example a metal oxide material. In some embodiments, the substrate may comprise a dielectric material. In some embodiments, the substrate may comprise a metal, or a metallic film, such as a metal nitride, metal carbide, metal silicide, or mixtures thereof. In some embodiments, the substrate may be a semiconductor substrate. In some embodiments, the substrate may comprise one or more three-dimensional structures. In some embodiments, one or more structures may have an aspect ratio of from 1:1 to 10:1 or greater. In some embodiments, the substrate may comprise an integrated circuit workpiece. In some embodiments, the substrate does not comprise semiconductor substrate or wafer.

The precursors employed in vapor deposition processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type, its surface area, and/or the size of the chamber the contacting time may be even higher than 10 seconds. Contacting times can be on the order of minutes in some cases, particularly for batch deposition processes on multiple substrates. The optimum contacting time can be determined by the skilled artisan based on the particular circumstances.

The mass flow rate of the precursors can also be determined by the skilled artisan. In some embodiments, the flow rate of precursors is between about 1 and 1000 sccm without limitation, more particularly between about 100 and 500 sccm for a single wafer deposition reactor. In some embodiments, the flow rate may be less than 100 secm, less than 75 secm, or less than 50 secm.

The pressure in a reaction chamber is typically from about 0.01 mbar to about 20 mbar, or from about 1 mbar to about 10 mbar. In some embodiments the reaction chamber pressure may be from about 0.01 mbar to about atmospheric pressure Before starting the deposition of the film, the substrate is typically heated to a suitable growth temperature. The growth temperature varies depending on the type of thin film formed, chemical and physical properties of the precursors, etc. The growth temperature can be less than the crystallization temperature for the deposited materials such that an amorphous thin film is formed or it can be above the crystallization temperature such that a crystalline thin film is formed. The deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

In some embodiments, the substrate temperature is high enough to support thermal ALD for the reactants of interest. For example, the substrate temperature is generally greater than about 100° C. and at or below about 700° C. In some embodiments, the substrate temperature is between about 100° C. and about 250° C., and in some embodiments the substrate temperature is between about 120° C. and about 200° C. In some embodiments, the substrate temperature is below about 500° C., below about 400° C. or below about 300° C. In some instances, the substrate temperature can be below about 200° C., below about 150° C. or below about 100° C.

In some embodiments a thin film comprising gold may be formed on a substrate by a process comprising at least one deposition cycle, the deposition cycle comprising alternately and sequentially contacting the substrate with a vapor phase gold precursor and a vapor phase second reactant. In some embodiments the deposition cycle may be repeated two or more times. In some embodiments, the deposition cycle may be repeated two or more times sequentially. In some embodiments excess gold precursor and reaction byproducts, if any, may be removed subsequent to contacting the substrate with a vapor phase gold precursor and prior to contacting the substrate with the vapor phase second reactant. In some embodiments excess second reactant and reaction byproducts, if any, may be removed subsequent to contacting the substrate with a vapor phase gold precursor and prior to beginning another deposition cycle. In some embodiments, the substrate may be contacted with a purge gas subsequent to contacting the substrate with the vapor phase gold precursor and prior to contacting the substrate with the vapor phase second reactant. In some embodiments, the substrate may be contacted with a purge gas subsequent to contacting the substrate with the vapor phase second reactant prior to beginning another deposition cycle.

The thin film comprising gold formed according to some embodiments is between about 20 nm and about 50 nm; however, the actual thickness chosen may be selected based on the intended application of the thin film. In some embodiments, it is desirable to ensure that all or most of a target substrate surface is covered by the thin film comprising gold. In some embodiments, it is desirable to form a continuous film comprising gold. In such cases, it may be desirable to form a film comprising gold that is at least about 10 nm thick, at least about 20 nm thick, at least about 30 nm thick, at least about 40 nm, or at least about 50 nm thick. In some embodiment's thickness great than 50 nm may be desired, for example thicknesses of greater than 100 nm, greater than 250 nm, or greater than 500 nm or greater. However, in some other embodiments it may be desirable to form a non-continuous thin film comprising gold, or a thin film comprising separate islands or nanoparticles comprising gold.

In some embodiments it may be desirable to form a thin film comprising gold with a certain number of deposition cycles, for example more than about 50 cycle, more than about 100 cycles, more than about 250 cycles, or more than about 500 cycles or more. In some embodiments, the deposition process may include any number of deposition cycles.

Reactors capable of being used to grow thin films can be used for the deposition. Such reactors include ALD reactors, as well as CVD reactors equipped with appropriate equipment and means for providing the precursors. According to some embodiments, a showerhead reactor may be used.

Examples of suitable reactors that may be used include commercially available single substrate (or single wafer) deposition equipment such as Pulsar® reactors (such as the Pulsar® 2000 and the Pulsar® 3000 and Pulsar® XP ALD), and EmerALD® XP and the EmerALD® reactors, available from ASM America, Inc. of Phoenix, Ariz. and ASM Europe B. V., Almere, Netherlands. Other commercially available reactors include those from ASM Japan K. K (Tokyo, Japan) under the tradename Eagle® XP and XP8.

In some embodiments, a batch reactor may be used. Suitable batch reactors include, but are not limited to, Advance® 400 Series reactors commercially available from and ASM Europe B. V (Almere, Netherlands) under the trade names A400 and A412 PLUS. In some embodiments a vertical batch reactor is utilized in which the boat rotates during processing, such as the A412. Thus, in some embodiments the wafers rotate during processing. In other embodiments, the batch reactor comprises a minibatch reactor configured to accommodate 10 or fewer wafers, eight or fewer wafers, 6 or fewer wafers, 4 or fewer wafers, or 2 wafers. In some embodiments in which a batch reactor is used, wafer-to-wafer uniformity is less than 3% (1 sigma), less than 2%, less than 1% or even less than 0.5%.

The deposition processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run. Additionally, in a cluster tool it is possible to reduce the time to pump the reaction space to the desired process pressure levels between substrates.

A stand-alone reactor can be equipped with a load-lock. In that case, it is not necessary to cool down the reaction space between each run. In some embodiments a deposition process for depositing a thin film comprising gold may comprise a plurality of deposition cycles, for example ALD cycles.

In a second phase, the substrate is contacted with a second reactant, for example a second reactant comprising ozone that may convert adsorbed first precursor to gold material. Contacting the substrate with a second reactant and thereafter removing excess second reactant and reaction byproducts, if any, from the substrate surface may be considered a phase and may be referred to as a second phase, second reactant phase, second precursor phase, etc.

One or more of the precursors may be provided with the aid of a carrier gas, such as $N_2$, Ar, or He. Additional phases may be added and phases may be removed as desired to adjust the composition of the final film. The terms "first" and "second" may be applied to any particular precursor or reactant depending on the sequencing of any particular embodiment. For example, depending on the embodiment the first reactant can be either a gold precursor or a second reactant.

Referring to FIG. 1 and according to some embodiments a thin film comprising gold is deposited on a substrate in a reaction space by a cyclical vapor deposition process 100 comprising at least one deposition cycle comprising:

contacting the surface of the substrate with a vapor phase gold precursor comprising at least one sulfur donor ligand (that is, a ligand bonded to a gold atom through a sulfur atom) and at least one alkyl ligand at block 110;

removing any excess gold precursor and reaction byproducts, if any, from the surface at block 120;

contacting the surface of the substrate with a vapor phase second reactant at block 130;

removing any excess second recant and reaction byproducts, if any, from the surface of the substrate at block 140; and optionally repeating the contacting and removing step at block 150 to form a thin film comprising gold of a desired thickness.

In some embodiments the above described cyclical deposition process 100 may be an ALD type process. In some embodiments the cyclical deposition process 100 may be an ALD process. In some embodiments the above-described cyclical deposition 100 may be a hybrid ALD/CVD or cyclical CVD process.

Although the illustrated deposition cycle begins with contacting the surface of the substrate with the vapor phase gold precursor, in other embodiments the deposition cycle may begin with contacting the surface of the substrate with the second reactant. It will be understood by the skilled artisan that if the surface of the substrate is contacted with a first precursor and that precursor does not react then the process will begin when the next precursor is provided.

In some embodiments removing the precursors or reactant and any excess reaction byproducts at blocks 120 and 140 may comprise purging the reaction space or reaction chamber. Purging the reaction chamber may comprise the use of a purge gas and/or the application of a vacuum to the reaction space. Where a purge gas is used, the purge gas may flow continuously or may be flowed through the reaction space only after the flow of a reactant gas has been stopped and before the next reactant gas begins flowing through the reaction space. It is also possible to continuously flow a purge or non-reactive gas through the reaction chamber so as to utilize the non-reactive gas as a carrier gas for the various reactive species. Thus, in some embodiments, a gas, such as nitrogen, continuously flows through the reaction space while the gold precursor and second reactant are pulsed as necessary into the reaction chamber. Because the carrier gas is continuously flowing, removing excess reactant or reaction by-products is achieved by merely stopping the flow of reactant gas into the reaction space.

In some embodiments removing the precursors or reactant and any excess reaction byproducts at blocks 120 and 140 may comprise moving the substrate from a first reaction chamber to a second, different reaction chamber containing a purge gas. In some embodiments removing the precursors or reactant and any excess reaction byproducts at blocks 120 and 140 may comprise moving the substrate from a first reaction chamber to a second, different reaction chamber under a vacuum. In some embodiments removing the precursors or reactant and any excess reaction byproducts at blocks 120 and 140 may comprise moving the substrate from a first precursor zone to a second, different precursor zone. The two zones can separated, for example, by a buffer zone comprising of a purge gas and/or vacuum.

In some embodiments the deposited thin film comprising gold may be subjected to a treatment process after deposition. In some embodiments this treatment process may, for example, enhance the conductivity or continuity of the deposited thin film comprising gold. In some embodiments a treatment process may comprise, for example an anneal process. In some embodiments the thin film comprising gold may be annealed in an atmosphere comprising one or more annealing gases, for example a gas comprising hydrogen.

Figure 2:
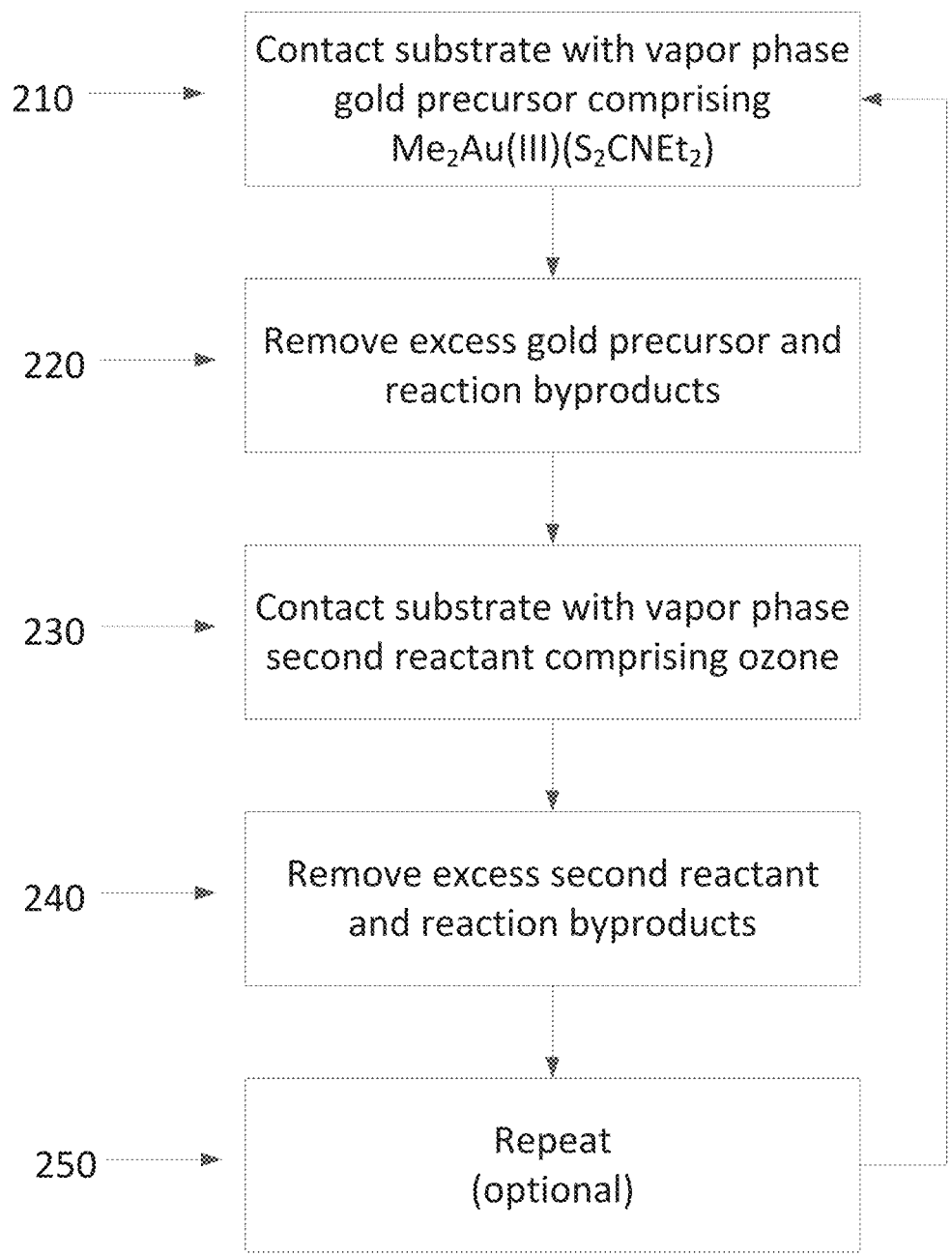
FIG. 2 is a process flow diagram generally illustrating an atomic layer deposition process for depositing thin films comprising gold.

Referring to FIG. 2 and according to some embodiments a thin film comprising gold is deposited on a substrate in a reaction space by an atomic layer deposition process 200 comprising at least one deposition cycle comprising:

contacting the surface of the substrate with a vapor phase gold precursor comprising $Me_2Au(S_2CNEt_2)$ at block 210;

removing any excess gold precursor and reaction byproducts, if any, from the surface at block 220;

contacting the surface of the substrate with a vapor phase second reactant comprising ozone at block 230;

removing any excess oxygen recant and reaction byproducts, if any, from the surface of the substrate at block 240; and optionally repeating the contacting and removing step at block 250 to form a thin film comprising gold of a desired thickness.

In some embodiments a thin film comprising gold is formed on a substrate by an ALD type process comprising at least one deposition cycle comprising:

contacting the surface of a substrate with a vapor phase gold precursor comprising at least one sulfur donor ligand and at least one alkyl ligand to form at most a molecular monolayer of gold precursor or a species thereof on the substrate;

removing excess gold precursor and reaction by products, if any, from the surface;

contacting the surface of the substrate with a vapor phase second reactant comprising ozone;

removing from the surface any excess second reactant and any gaseous by-products formed in the reaction between the gold precursor layer and the second reactant comprising ozone.

The contacting and removing steps can be repeated until a thin film comprising gold of the desired thickness has been formed.

In some embodiments a thin film comprising gold deposition process may further comprise subjecting the substrate to a pretreatment process prior to contacting the substrate with the first vapor phase gold precursor. In some embodiments a pretreatment process may comprise exposing the substrate to a pretreatment reactant. In some embodiments the pretreatment reactant may remove undesirable contaminants or may prepare the surface for subsequent deposition of the thin film comprising gold. In some embodiments the pretreatment reactant may comprise, for example, HCl, HF, or a reactive species, such as plasma.

Gold Precursors

In some embodiments the gold precursor used in a vapor deposition process for depositing a thin film comprising gold may comprise an organometallic compound. In some embodiments the gold precursor may comprise an organometallic compound comprising sulfur. In some embodiments the gold precursor may comprise at least one ligand comprising sulfur, such as a sulfur donor ligand, and at least one alkyl ligand, for example, at least one methyl, or ethyl ligand. As used herein, a sulfur donor ligand is a ligand that is bonded via a sulfur atom. In some embodiments the gold of the gold precursor may comprise an oxidation state of +III. In some embodiments the gold precursor may comprise at least one sulfur donor ligand and two independently selected alkyl ligands. In some embodiments the gold precursor comprises at least one bidentate ligand comprising sulfur, such as bidentate sulfur donor ligand. In some embodiments the bidentate sulfur donor ligand comprises one sulfur atom, or in some embodiments two sulfur atoms. In some embodiments the bidentate sulfur donor ligand comprises one sulfur atom, such as a donor sulfur atom bonded to gold, and one other atom, such as nitrogen, selenium, or oxygen atom bonded to gold. In some embodiments the bidentate sulfur donor ligand makes the compound thermally stable. In some embodiments the gold precursor comprises at least two monodentate ligands comprising sulfur, such as sulfur donor ligands. In some embodiments the gold precursor comprises at least two monodentate ligands comprising sulfur, such as two sulfur donor ligands and an alkyl ligand.

In some embodiments the gold precursor may comprise an organometallic compound comprising selenium. In some embodiments the gold precursor may comprise at least one ligand comprising selenium, such as a selenium donor ligand, and at least one alkyl ligand, for example, at least one methyl, or ethyl ligand. As used herein, a selenium donor ligand is a ligand that is bonded via a selenium atom. In some embodiments the gold of the gold precursor may comprise an oxidation state of +III. In some embodiments the gold precursor may comprise at least one selenium donor ligand and two independently selected alkyl ligands. In some embodiments the gold precursor comprises at least one bidentate ligand comprising selenium, such as bidentate selenium donor ligand. In some embodiments the bidentate selenium donor ligand comprises one selenium atom, or in some embodiments two selenium atoms. In some embodiments the bidentate selenium donor ligand comprises one v atom, such as a donor selenium atom bonded to gold, and one other atom, such as nitrogen, selenium, or oxygen atom bonded to gold. In some embodiments the bidentate selenium donor ligand makes the compound thermally stable. In some embodiments the gold precursor comprises at least two monodentate ligands comprising selenium, such as selenium donor ligands. In some embodiments the gold precursor comprises at least two monodentate ligands comprising selenium, such as two selenium donor ligands and an alkyl ligand.

In some embodiments the gold precursor may comprise one or more additional neutral adducts. Adduct forming ligands may be ethers, polyethers, thioethers, polythioethers, amines or polyamines or derivatives thereof, such THF (tetrahydrofuran), DME (dimethylether), diglyme, dimethylsulfide, 1,2-bis(methylthio)ethane, tetrahydrothiophene, TMEDA (tetramethylethylenediamine), diene, $Et_3N$, pyridine, quinuclidine or 1-methylpyrrolidine or derivatives thereof.

In some embodiments the gold precursor may comprise two independently selected alkyl ligands and a ligand comprising sulfur, such as a sulfur donor ligand. In some embodiments the ligand comprising sulfur may comprise a dithiocarbamato ligand. In some embodiments the ligand comprising sulfur may comprise a thiocarbamato ligand. In some embodiments the ligand comprising sulfur may comprise an alkylthiocarbamato ligand, for example a dialkylthiocarbamato ligand. In some embodiments the ligand comprising sulfur may comprise a dialkylthiocarbamato ligand, such as diethylthiocarbamato ligand. In some embodiments the ligand comprising sulfur may comprise a dialkyldithiocarbamato ligand, such as diethyldithiocarbamato ligand. In some embodiments the gold precursor may comprise diethyldithiocarbamate of dimethylgold(III) ($Me_2Au(S_2CNEt_2)$). In some embodiments the gold precursor may comprise thioamidato, beta-thiodiketonato, beta-dithiodiketonato, beta-thioketoiminato, thiocarboksylato, and/or dithiocarboxylato ligands.

In some embodiments the gold precursor may comprise a ligand comprising sulfur, such as a sulfur donor ligand, and a bidentate ligand, for example a ligand selected from one of 2,2,6,6-tetramethyl-3,5-heptanedionato (thd), hexafluoroacetylacetonato (hfac), and 2,2-dimethyl-6,6,7,7,8,8,8-heptafluorooctane-3,5-dionato (fod). In some embodiments the gold precursor may comprise two independently selected alkyl ligands and a carboxylato ligand, thiocarboxylato ligand, or dithiocarboxylato ligand. In some embodiments the gold precursor may comprise an alkyl ligand, such as two independently selected alkyl ligands and a ligand having the formula SR, wherein R is an independently selected alkyl groups. In some embodiments the gold precursor may also comprise a ligand having the formula OR, wherein R is an independently selected alkyl group.

In some embodiments the alkyl ligand of the gold precursor may comprise less than 5, less than 4, less than 3 or less than two carbon atoms. In some embodiments the alkyl ligand may comprise one carbon atom, such as in Me. In some embodiments the alkyl ligand may comprise two carbon atoms, such as in Et. In some embodiments the alkyl ligand is not a substituted alkyl ligand.

Second Reactants

In some embodiments the second reactant may comprise oxygen. In some embodiments the second reactant may comprise a reactive species of oxygen, for example oxygen atoms, oxygen radicals, oxygen ions, and/or oxygen plasma. In some embodiments the second reactant may comprise ozone ($O_3$). In some embodiments the second reactant may comprise molecular oxygen ($O_2$) and ozone. In some embodiments the second reactant may not comprise a compound comprising oxygen other than ozone. In some embodiments the second reactant may comprise nitrogen, for example $N_2O$. In some embodiments, the second reactant may comprise a peroxide, for example $H_2O_2$.

In some embodiments the second reactant may not comprise $H_2O$. In some embodiments, the second reactant does not comprise a plasma, for example an oxygen plasma. However, in some other embodiments the second reactant may comprise reactive species generated by a plasma from a gas comprising oxygen.

In some embodiments the second precursor comprises ozone and less than about 50%, 25%, 15%, 10%, 5%, 1%, or 0.1% of impurities other than inert gases.

Thin Film Characteristics

Thin films comprising gold deposited according to some of the embodiments described herein may be continuous thin films comprising gold. In some embodiments the thin films comprising gold deposited according to some of the embodiments described herein may be continuous at a thickness below about 100 nm, below about 60 nm, below about 50 nm, below about 40 nm, below about 30 nm, below about 25 nm, or below about 20 nm or below about 15 nm or below about 10 nm or below about 5 nm or lower. The continuity referred can be physically continuity or electrical continuity. In some embodiments, the thickness at which a film may be physically continuous may not be the same as the thickness at which a film is electrically continuous, and the thickness at which a film may be electrically continuous may not be the same as the thickness at which a film is physically continuous.

While in some embodiments a thin film comprising gold deposited according to some of the embodiments described herein may be continuous, in some embodiments it may be desirable to form a non-continuous thin film comprising gold, or a thin film comprising separate islands or nanoparticles comprising gold. In some embodiments the deposited thin film comprising gold may comprise nanoparticles comprising gold that are not substantially physically or electrically continuous with one another. In some embodiments the deposited thin film comprising gold may comprise separate nanoparticles, or separate islands, comprising gold.

In some embodiments a thin film comprising gold deposited according to some of the embodiments described herein may have a resistivity of less than about 20 μΩcm at a thickness of less than about 100 nm. In some embodiments a thin film comprising gold deposited according to some of the embodiments described herein may have a resistivity of less than about 20 μΩcm at a thickness of below about 60 nm, below about 50 nm, below about 40 nm, below about 30 nm, below about 25 nm, or below about 20 nm or lower. In some embodiments a thin film comprising gold deposited according to some of the embodiments described herein may have a resistivity of less than about 15 μΩcm at a thickness of below about 60 nm, below about 50 nm, below about 40 nm, below about 30 nm, below about 25 nm, or below about 20 nm or lower. In some embodiments a thin film comprising gold deposited according to some of the embodiments described herein may have a resistivity of less than about 10 μΩcm at a thickness of below about 60 nm, below about 50 nm, below about 40 nm, below about 30 nm, below about 25 nm, or below about 20 nm or lower. In some embodiments a thin film comprising gold deposited according to some of the embodiments described herein may have a resistivity of less than about 200 μΩcm at a thickness of below about 30 nm, below about 20 nm, below about 15 nm, below about 10 nm, below about 8 nm, or below about 5 nm or lower.

In some embodiments a thin film comprising gold deposited according to some of the embodiments described herein may have a resistivity of less than about 200 μΩcm, less than about 100 μΩcm, less than about 50 μΩcm, less than about 30 μΩcm, less than about 20 μΩcm, less than about 18 μΩcm, less than about 15 μΩcm, less than about 12 μΩcm, less than about 10 μΩcm, less than about 8 μΩcm, or less than about 5 μΩcm or lower at a thickness of less than about 100 nm. In some embodiments a thin film comprising gold deposited according to some of the embodiments described herein may have a resistivity of less than about 20 μΩcm, less than about 18 μΩcm, less than about 15 μΩcm, less than about 12 μΩcm, less than about 10 μΩcm, less than about 8 μΩcm, or less than about 5 μΩcm or lower at a thickness of less than about 50 nm.

In some embodiments a thin film comprising gold deposited according to some of the embodiments described herein may be crystalline or polycrystalline. In some embodiments a thin film comprising gold deposited according to some of the embodiments described herein may have a cubic crystal structure.[0088] [0083]In some embodiments a thin film comprising gold deposited according to some of the embodiments described herein may have a thickness from about 20 nm to about 100 nm. In some embodiments a thin film comprising gold deposited according to some of the embodiments described herein may have a thickness from about 20 nm to about 60 nm. In some embodiments a thin film comprising gold deposited according to some of the embodiments described herein may have a thickness greater than about 20, greater than about 30 nm, greater than about 40 nm, greater than about 50 nm, greater than about 60 nm, greater than about 100 nm, greater than about 250 nm, greater than about 500 nm, or greater. In some embodiments a thin film comprising gold deposited according to some of the embodiments described herein may have a thickness of less than about 50 nm, less than about 30 nm, less than about 20 nm, less than about 15 nm, less than about 10 nm, less than about 5 nm or in some instances the amount of gold corresponds to thickness of less than about 5 nm, less than about 3 nm, less than about 2 nm or less than about 1 nm, for example, if a non-continuous film or separate particles or islands comprising gold are desired.

In some embodiments the growth rate of the film is from about 0.01 Å/cycle to about 5 Å/cycle, from about 0.05 Å/cycle to about 2 Å/cycle. In some embodiments the growth rate of the film is more than about 0.1 Å/cycle, more than about 0.3 Å/cycle, more than about 0.5 Å/cycle, more than about 0.7 Å/cycle, more than about 0.8 Å/cycle, more than about 0.9 Å/cycle, more than about 1 Å/cycle, more than about 1.1 Å/cycle, or more than about 1.2 Å/cycle or more.

In some embodiments a thin film comprising gold may comprise less than about 20 at-%, less than about 10 at-%, less than about 7 at-%, less than about 5 at-%, less than about 3 at-%, less than about 2 at-%, or less than about 1 at-% of impurities, that is, elements other than Au. In some embodiments the thin film comprising gold comprise less than about 20 at-%, less than about 10 at-%, less than about 5 at-%, less than about 2 at-%, or less than about 1 at-% of hydrogen. In some embodiments the thin film comprising gold may comprise less than about 10 at-%, less than about 5 at-%, less than about 2 at-%, less than about 1 at-% or less than about 0.5 at-% of carbon. In some embodiments the thin film comprising gold may comprise less than about 5 at-%, less than about 2 at-%, less than about 1 at-%, less than about 0.5 at-%, or less than about 0.2 at-% of nitrogen. In some embodiments the thin film comprising gold may comprise less than about 15 at-%, less than about 10 at-%, less than about 5 at-%, less than about 3 at-%, less than about 2 at-%, or less than about 1 at-% of oxygen. In some embodiments the thin film comprising gold may comprise less than about 5 at-%, less than about 1 at-%, less than about 0.5 at-%, less than about 0.2 at-%, or less than about 0.1 at-% of sulfur. In some embodiments the thin film comprising gold may comprise more than about 80 at-%, more than about 90 at-%, more than about 93 at-%, more than about 95 at-%, more than about 97 at-%, or more than about 99 at-% gold.

In some embodiments the thin films comprising gold may be deposited on a three-dimensional structure. In some embodiments the step coverage of the thin film comprising gold may be equal to or greater than about 50%, greater than about 80%, greater than about 90%, about 95%, about 98% or about 99% or greater in structures having aspect ratios (height/width) of more than about 2, more than about 5, more than about 10, more than about 25 or more than about 50.

EXAMPLES

Example 1

Figure 3:
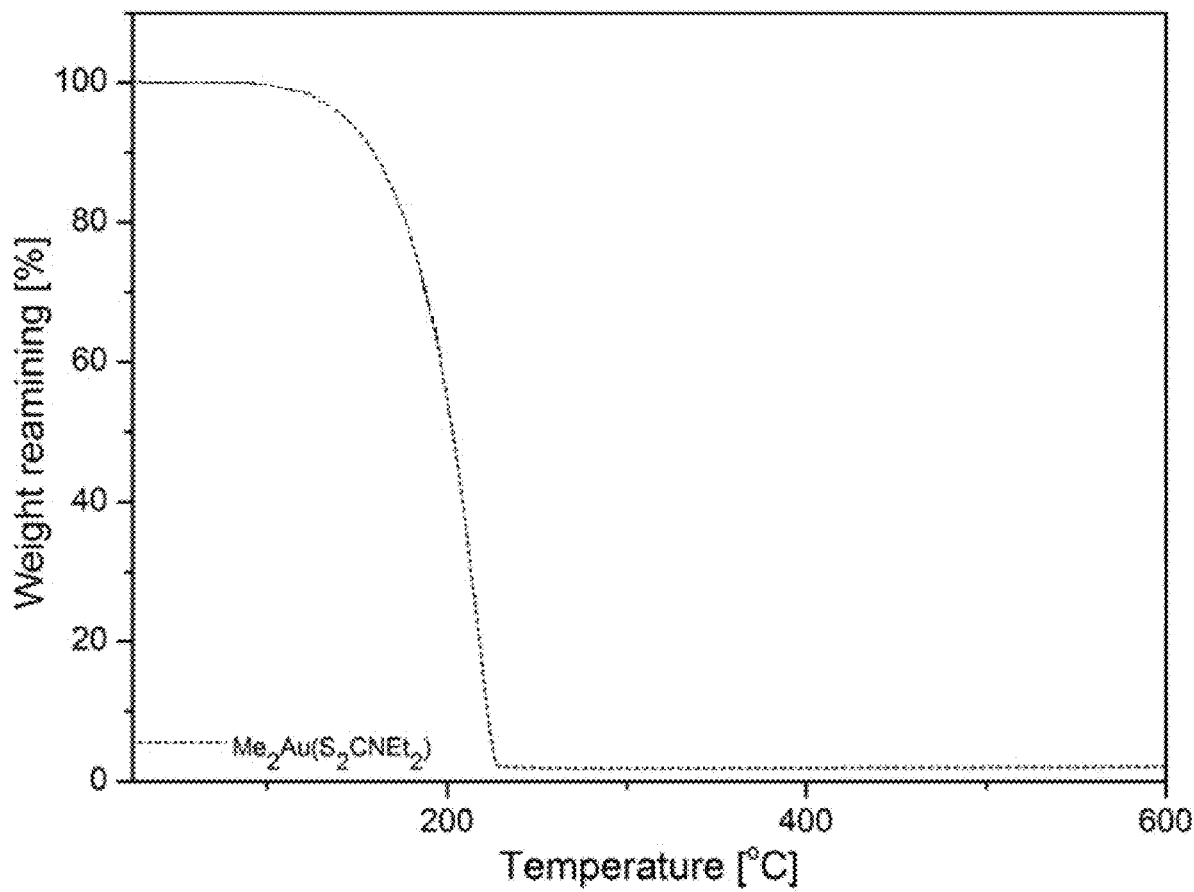
FIG. 3 illustrates a thermogravimetric curve for $Me_2Au(S_2CNEt_2)$.

The thermal properties of diethyldithiocarbamate of dimethylgold(III) (Me$_2$Au(S$_2$CNEt$_2$)) were investigated. Me$_2$Au(S$_2$CNEt$_2$) was found to be a solid at room temperature. When heated, Me$_2$Au(S$_2$CNEt$_2$) was found to melt between about 40° C. and about 44° C. As shown in FIG. 3, the thermogravimetric analysis (TGA) curve for Me$_2$Au(S$_2$CNEt$_2$) (10° C./min heating rate, 10 mg sample size, N$_2$ flow at 1 atm) shows almost complete evaporation below about 220° C.

Example 2

Thin films comprising gold were deposited by ALD type processes according to some embodiments and described herein. Me$_2$Au(S$_2$CNEt$_2$) was used as the gold precursor and ozone (O3) was used as the second reactant. Sample thin films comprising gold were deposited at temperatures of 120° C., 150° C., 180° C., and 200° C. Each thin film sample was deposited by a deposition process according to some embodiments and as described herein including 500 deposition cycles, each cycle having a gold precursor pulse time of 1 second, a gold precursor purge time of 1 second, an ozone pulse time of 1 second and an ozone purge time of 1 second.

Figure 4A:
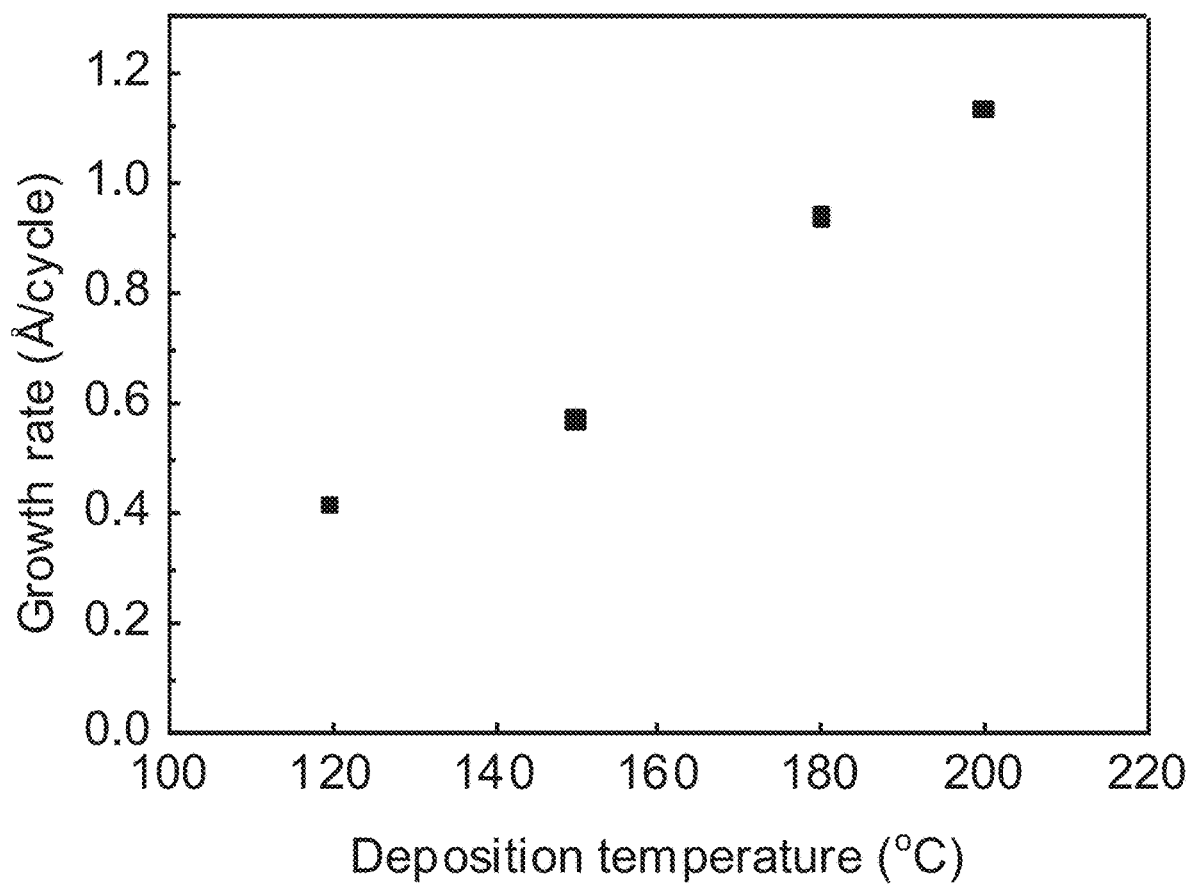
FIG. 4A is a plot of thin film growth rate versus deposition temperature for thin films comprising gold deposited by cyclical vapor deposition processes as described herein and according to some embodiments.

As shown in FIG. 4A, the growth rate, measured in Å/cycle, increased with increasing thin film deposition temperature, from about 0.4 Å/cycle at 120° C. to about 1.1 Å/cycle at 200° C.

Figure 4B:
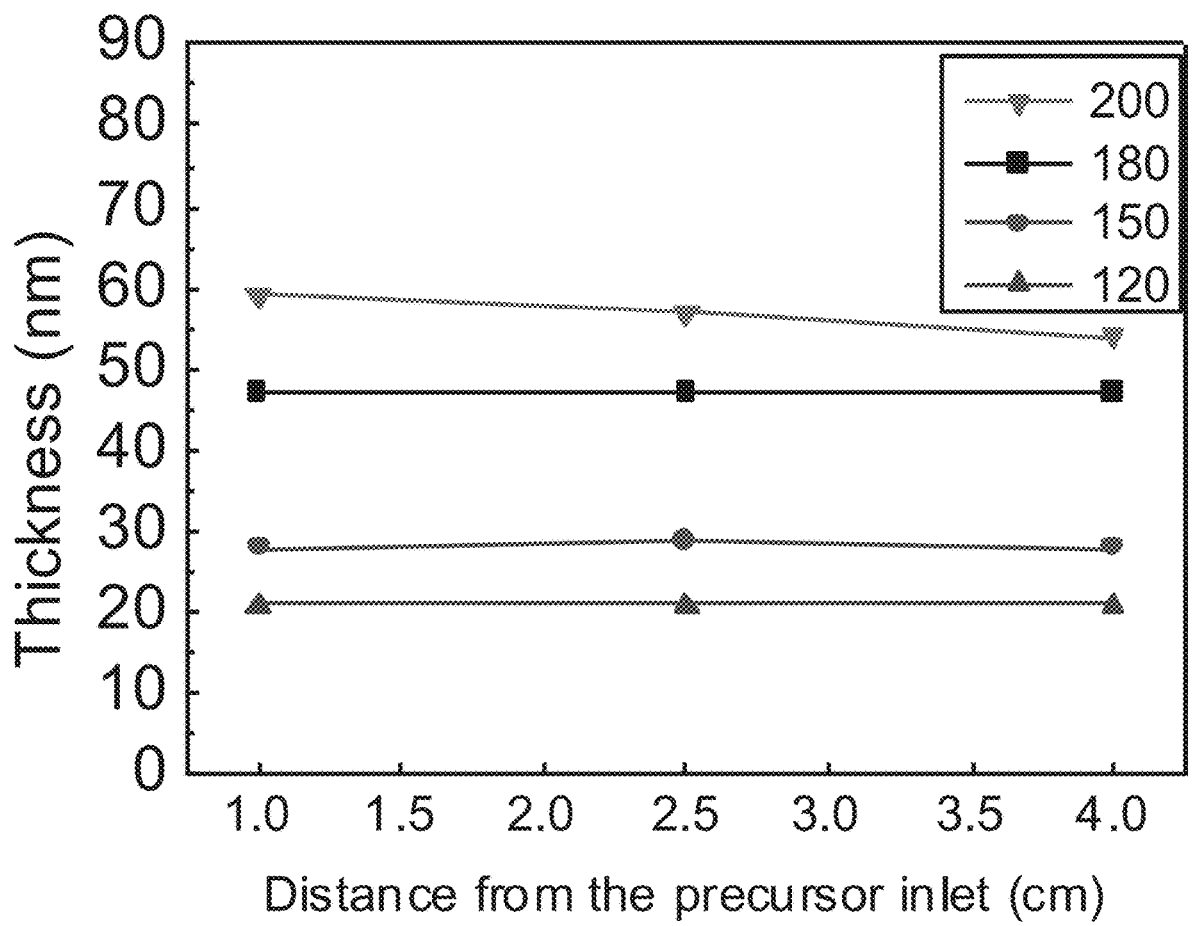
FIG. 4B is a plot of thin film thickness versus film distance from the gold precursor inlet in a reaction chamber for thin films comprising gold deposited at temperatures from 120° C. to 200° C. by cyclical vapor deposition processes as described herein and according to some embodiments.

The sample thin films were found to be uniform, as shown in FIG. 4B. The thicknesses of each sample thin film comprising gold remained approximately uniform over the entirety of the substrate, from adjacent to the precursor inlet of the reaction space to 4.0 cm away from the precursor inlet. Unlike previous vapor deposition processes based on chemical reactions, such as ALD or CVD, for thin films comprising gold, this uniformity was achieved at very low film thicknesses, from about 20 nm to about 60 nm.

Figure 4C:
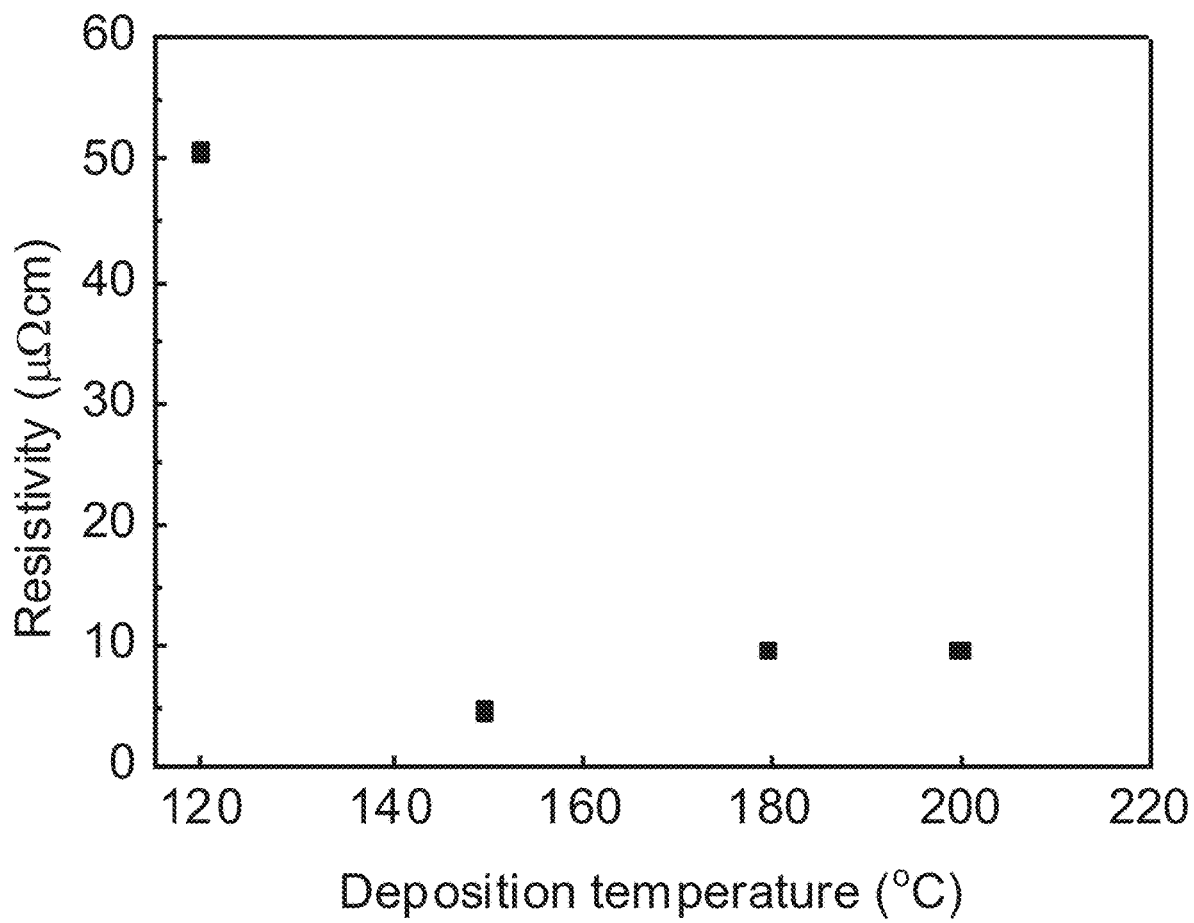
FIG. 4C is a plot of thin film resistivity versus deposition temperature for thin films comprising gold deposited at temperatures from 120° C. to 200° C. by cyclical vapor deposition processes as described herein and according to some embodiments.

The resistivity of the sample thin films was measured, and it was found that all of the deposited sample thin films were conductive, as shown in FIG. 4C. The resistivity decreased from about 50 μΩcm at a deposition temperature of 120° C. to about 5 μΩcm at a deposition temperature of 150° C., and remained below about 10 μΩcm for the films deposited at 180° C. and 200° C. These results indicated that, unlike previous vapor deposition processes for gold, the deposited sample films comprising gold were continuous and conductive.

Figure 4D:
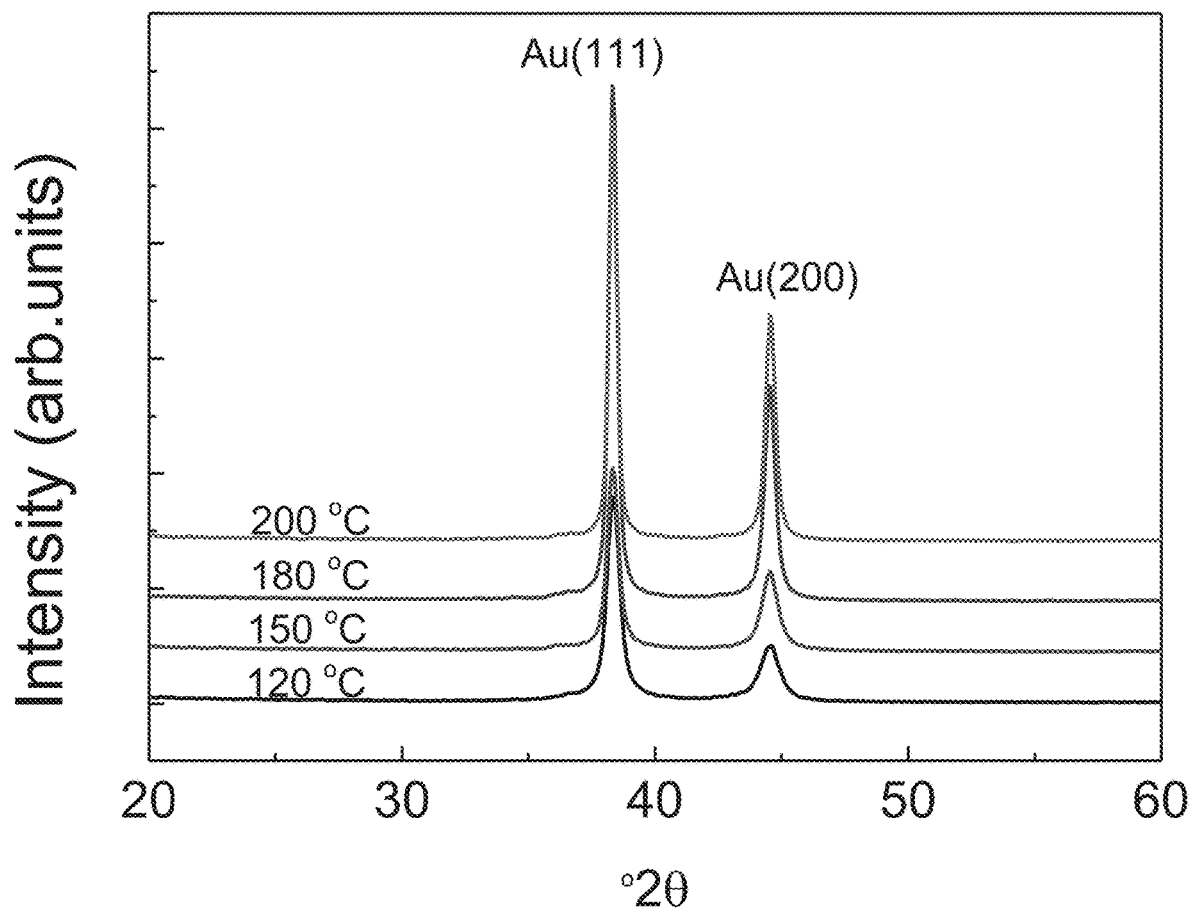
FIG. 4D is an X-ray diffractogram for thin films comprising gold deposited at temperatures from 120° C. to 200° C. by cyclical vapor deposition processes as described herein and according to some embodiments.
Figure 5A:
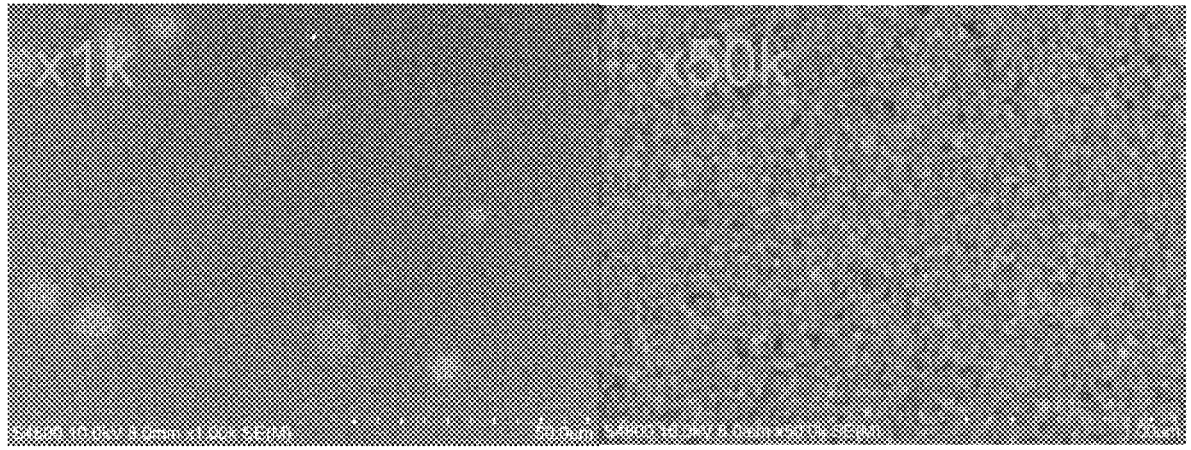
FIGS. 5A-D are scanning electron microscope (SEM) images of thin films comprising gold deposited at temperatures from 120° C. to 200° C. by cyclical vapor deposition processes as described herein and according to some embodiments.
Figure 5B:
Figure 5C:
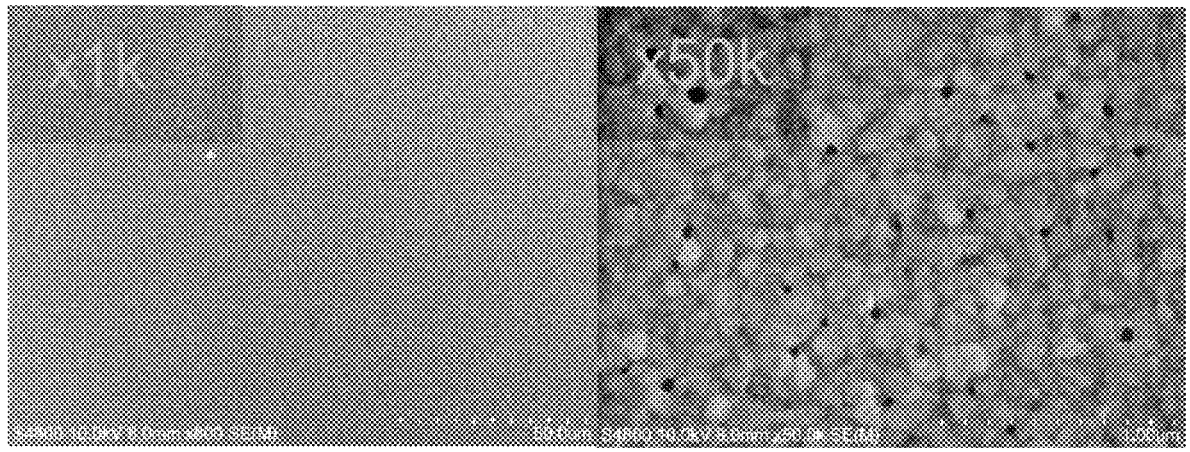
Figure 5D:
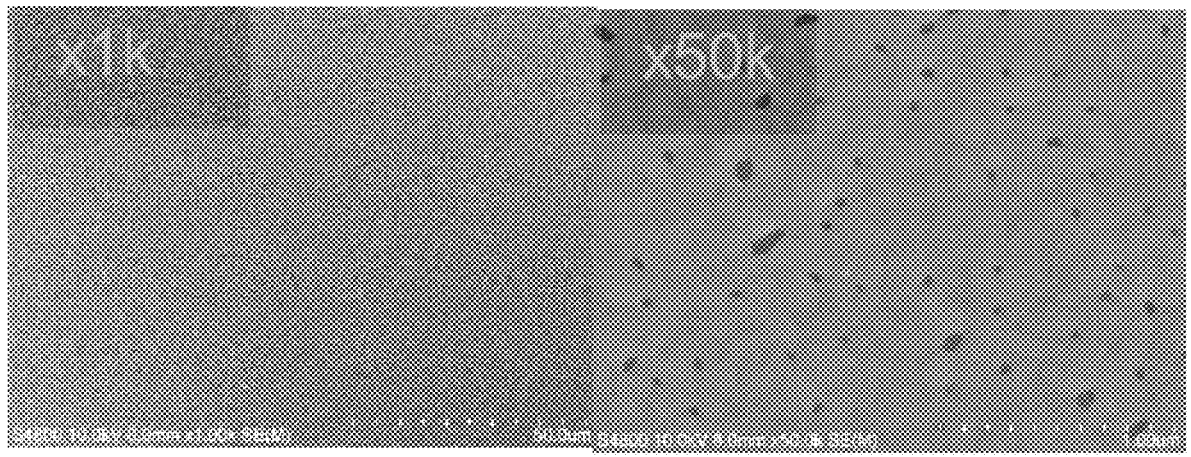

The crystal structure of the deposited sample films was investigated via X-ray diffraction. As shown in FIG. 4D, the intensity peaks of the X-ray diffractogram show that the sample films had cubic crystal structures at all deposition temperatures, indicating the deposition of metallic gold.

The sample thin films were also investigated using scanning electron microscopy, as shown in FIGS. 5A-D. The SEM images show that, unlike previous gold vapor deposition methods, the sample thin films comprising gold were uniform and continuous for all deposition temperatures between 120° C. and 200° C. at low thicknesses, from about 20 nm to about 60 nm. The deposited sample thin films comprising gold completely covered the substrate at all deposition temperatures between 120° C. and 200° C.

Example 3

Thin films comprising gold were deposited according to ALD type processes according to some embodiments and described herein. Me$_2$Au(S$_2$CNEt$_2$) was used as the gold precursor and ozone (O3) was used as the second reactant. The deposition temperature for all sample thin films was 180° C. Each thin film sample was deposited by a deposition process according to some embodiments and as described herein including 500 deposition cycles. The gold precursor and second reactant pulse times were varied from 0.5 seconds to 2 seconds, while the purge times were held constant at 1 second.

Figure 6A:
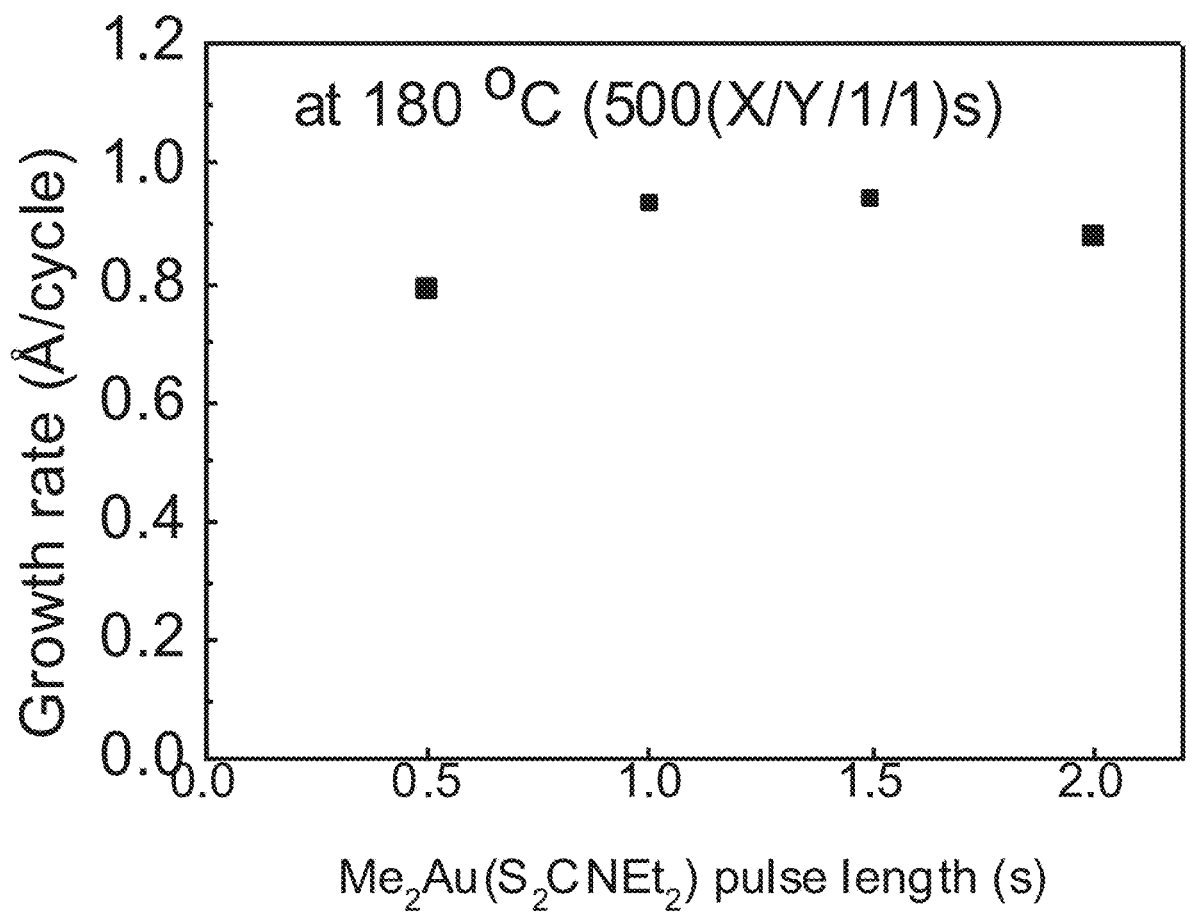
FIG. 6A is a plot of thin film growth rate versus gold precursor pulse length for thin films comprising gold deposited at a temperature of 180° C. by cyclical vapor deposition processes as described herein and according to some embodiments.

As shown in FIG. 6A, the growth rate, measured in Å/cycle, saturated at a precursor pulse length of 1 second. This growth rate was found to be about 0.9 Å/cycle. The growth rate varied from about 0.8 Å/cycle to about 0.9 Å/cycle for the range of precursor pulse lengths investigated.

Figure 6B:
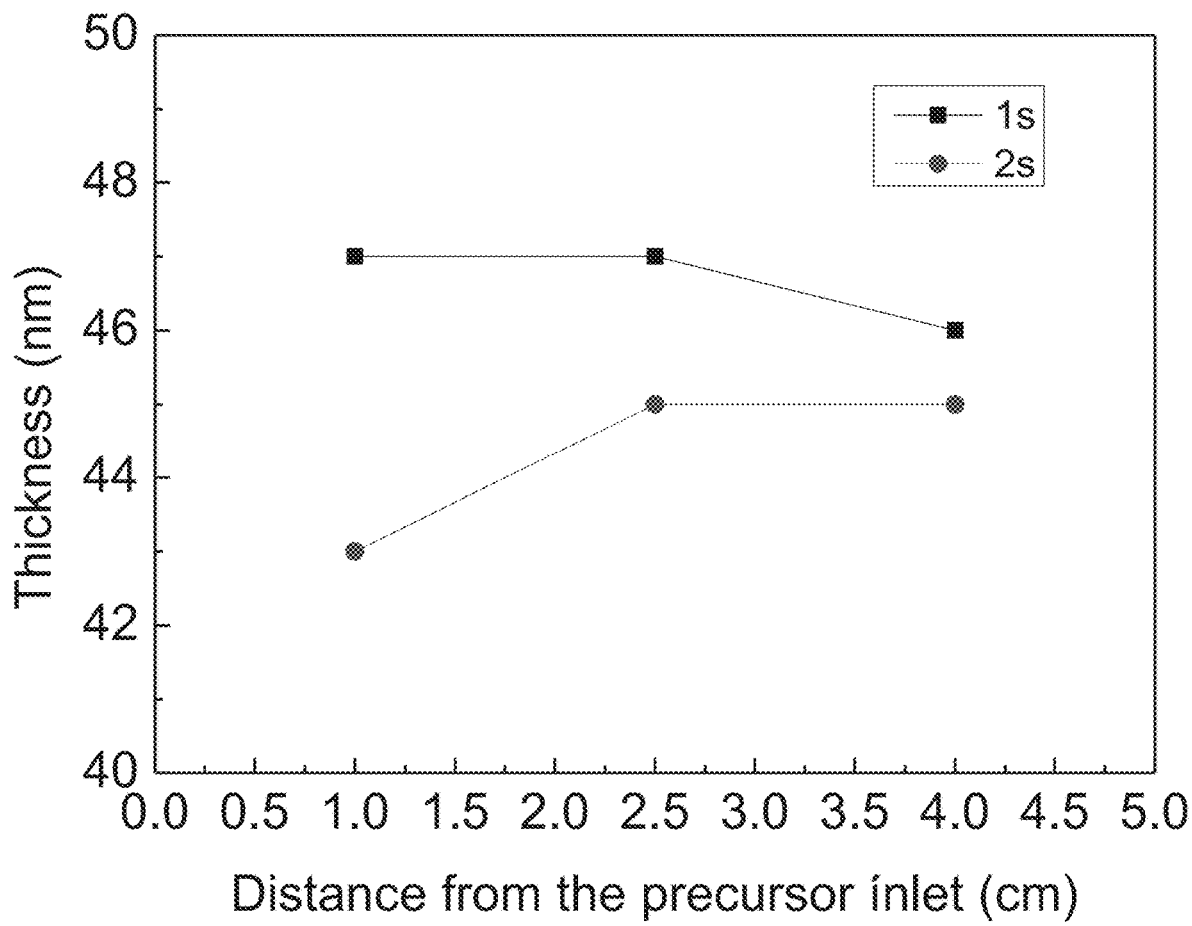
FIG. 6B is a plot of thin film thickness versus film distance from the gold precursor inlet in a reaction chamber for thin films comprising gold deposited with gold precursor pulse lengths of 1 second and 2 seconds by cyclical vapor deposition processes as described herein and according to some embodiments.

As shown in FIG. 6B, the sample thin film comprising gold deposited with a precursor pulse time of 1 second was found to be more uniform than the sample film deposited with a precursor pulse time of 2 seconds. In both cases, the sample thin films were found to be uniform and continuous at very low thicknesses, from about 43 nm to about 45 nm.

Figure 6C:
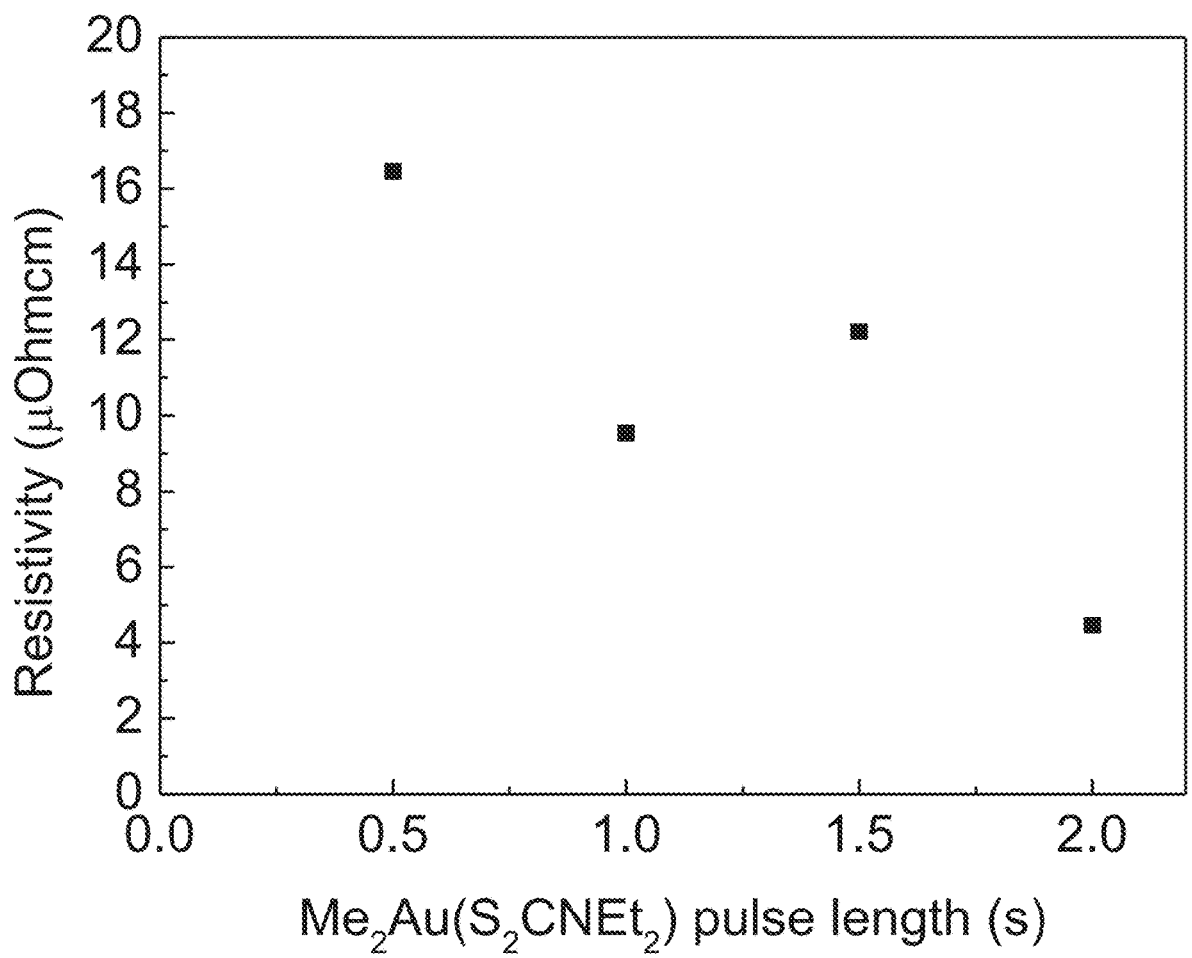
FIG. 6C is a plot of thin film resistivity versus gold precursor pulse length for thin films comprising gold deposited by cyclical vapor deposition processes as described herein and according to some embodiments.

The resistivity of the sample thin films was measured, and it was found that all of the deposited sample thin films were conductive, as shown in FIG. 6C. The resistivity decreased from about 17 μΩcm for a deposition process having a precursor pulse time of 0.5 seconds to about 5 μΩcm deposition process having a precursor pulse time of 2 seconds. It was found that the resistivity increased slightly from about 10 μΩcm to about 12 μΩcm as the precursor pules time increased from 1 second to 1.5 seconds. These results indicated that, the deposited sample films comprising gold were continuous and conductive.

Example 4

Thin films comprising gold were deposited according to ALD type processes according to some embodiments and described herein. $Me_2Au(S_2CNEt_2)$ was used as the gold precursor and ozone (03) was used as the second reactant. Sample thin films were deposited at a temperature of 180° C. The number of deposition cycles was varied for each sample film, from 50 to 500 cycles. Each deposition cycle had a gold precursor pulse time of 1 second, a gold precursor purge time of 1 second, an ozone pulse time of 1 second and an ozone purge time of 1 second.

Figure 7A:
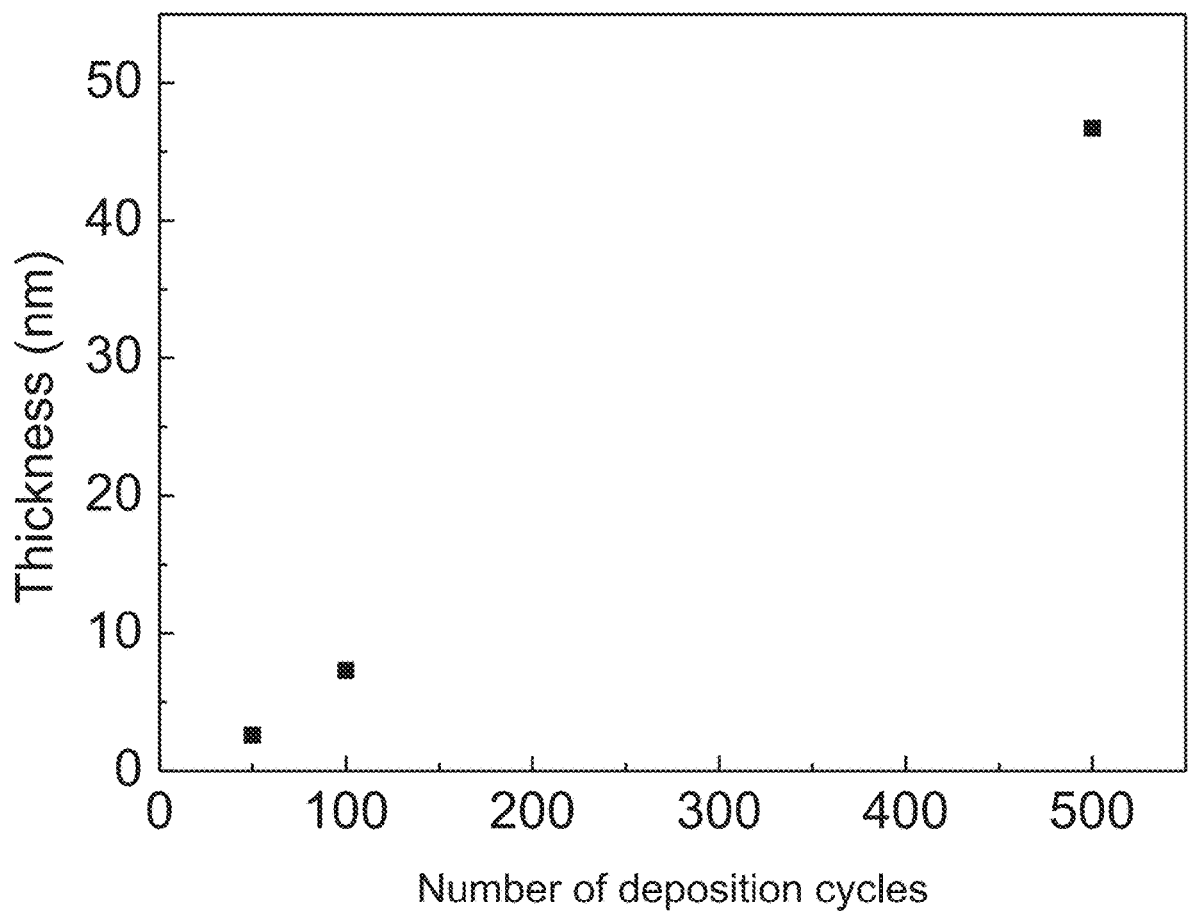
FIG. 7A is a plot of thin film thickness versus number of deposition cycles for thin films comprising gold deposited by cyclical vapor deposition processes as described herein and according to some embodiments.

As shown in FIG. 7A, the sample thin film thicknesses increased approximately linearly from less than about 5 nm for a deposition process including 50 deposition cycles to about 45 nm for a deposition process including 500 deposition cycles.

Figure 7B:
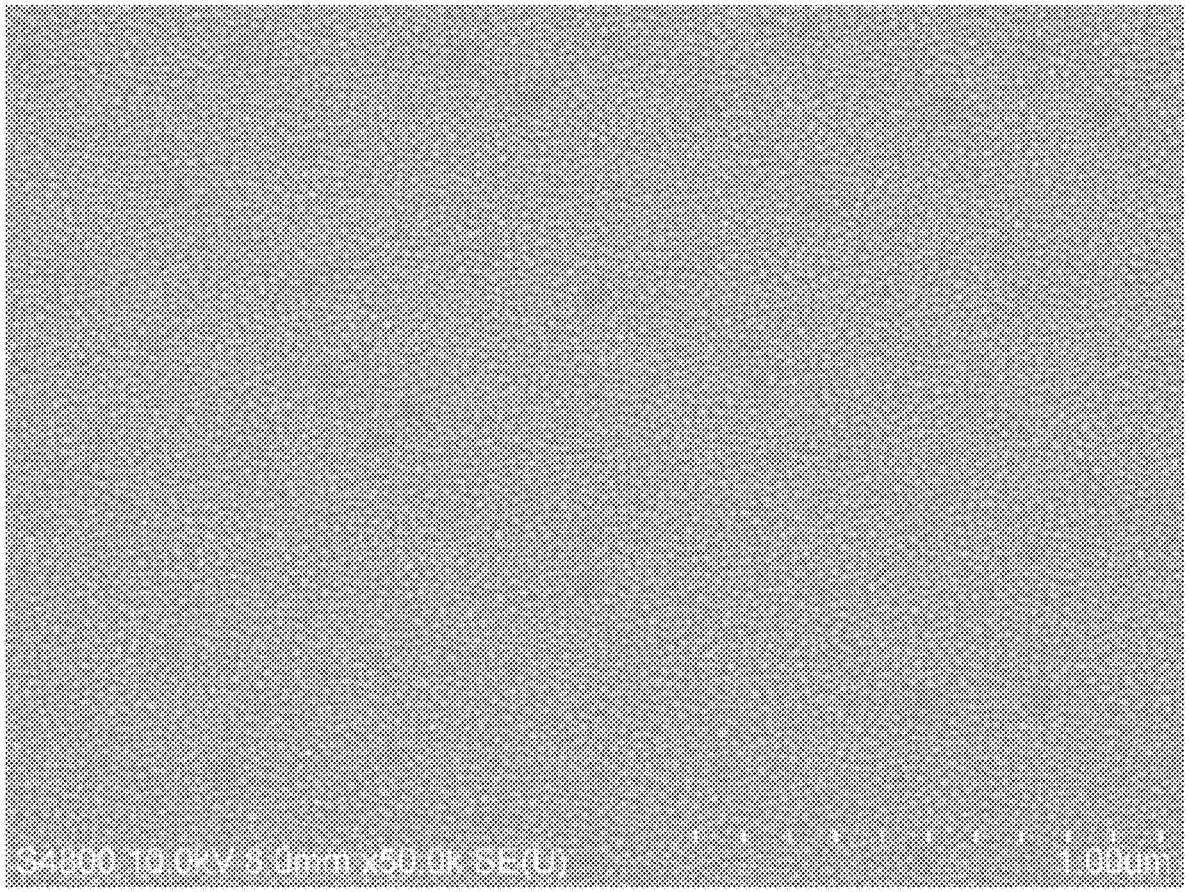
FIGS. 7B-D are SEM images of thin films comprising gold deposited with between 50 and 500 cycles by cyclical vapor deposition processes as described herein and according to some embodiments.
Figure 7C:
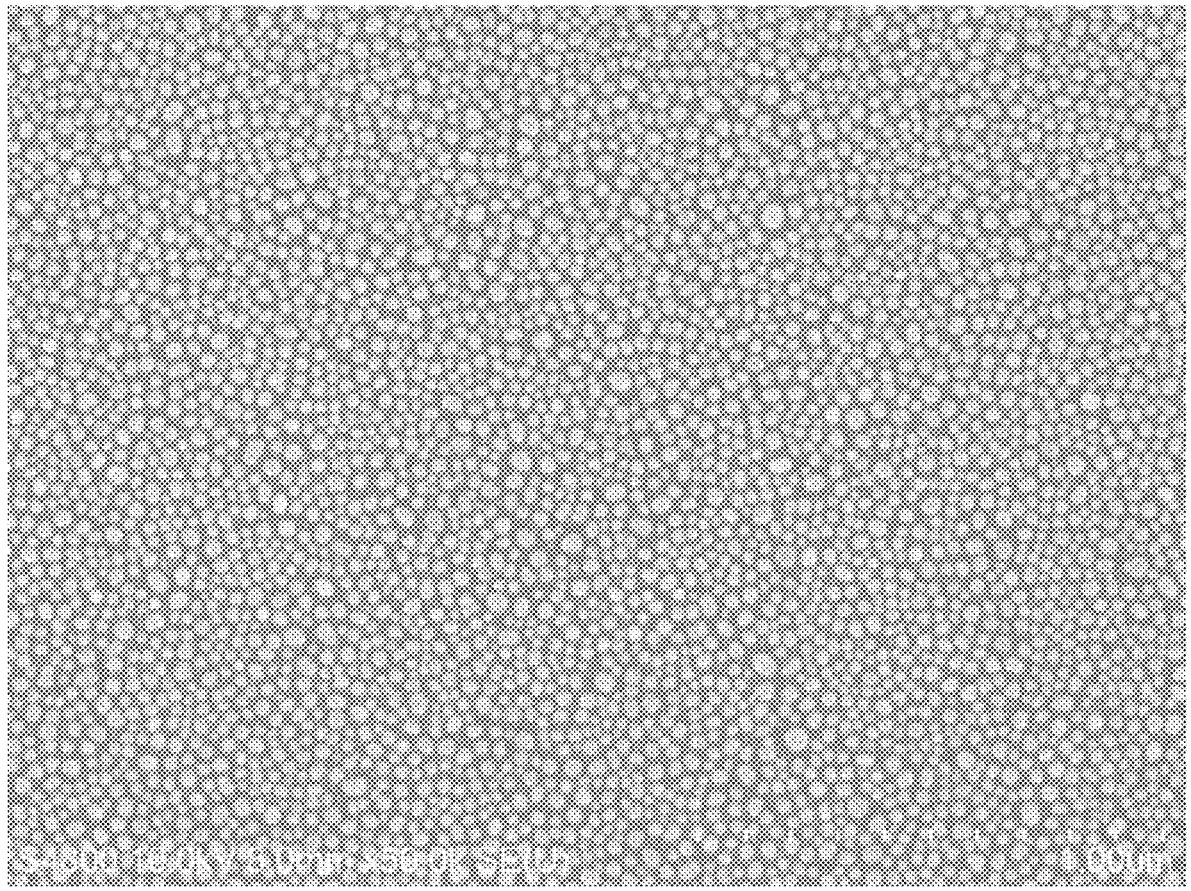
Figure 7D:
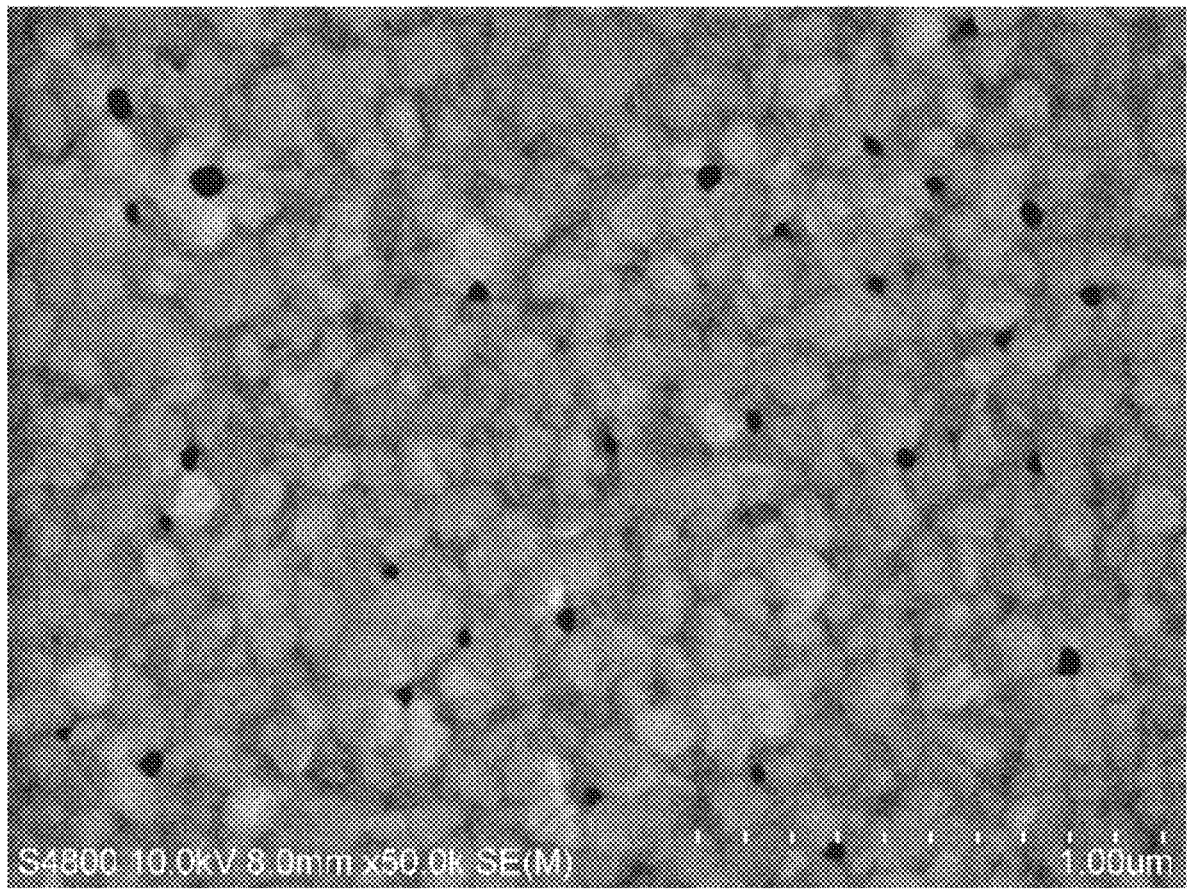

The sample thin films were also investigated using scanning electron microscopy, as shown in FIGS. 7B-D. The SEM images show that, the sample thin film deposited by 500 cycles was uniform and continuous.

Example 5

Sample thin films comprising gold were deposited according to ALD type processes according to some embodiments and described herein. $Me_2Au(S_2CNEt_2)$ was used as the gold precursor and ozone ($O_3$) was used as the second reactant. A first sample was prepared with a deposition temperature 120° C., while a second sample was prepared with a deposition temperature 180° C. Both thin film samples were deposited by a deposition process according to some embodiments and as described herein including 500 deposition cycles, each cycle having a gold precursor pulse time of 10 second, a gold precursor purge time of 10 second, an ozone pulse time of 10 second and an ozone purge time of 10 second.

The first sample thin film comprising gold deposited at 120° C. was found to be about 21 nm thick. The second sample thin film comprising gold deposited at 180° C. was found to be about 47 nm thick. The composition of the thin films was analysed and is shown below in Table 1. No sulfur was detected in either sample film.

TABLE 1

| Film composition for two sample thin films comprising gold deposited at 120° C. and 180° C. | | |
|---|---|---|
| | Composition of film deposited at 120° C. (at-%) | Composition of film deposited at 180° C. (at-%) |
| Au | 91.23 ± 0.99 | 95.88 ± 0.78 |
| H | 2.16 ± 0.57 | 0.85 ± 0.30 |
| C | 0.85 ± 0.19 | 0.20 ± 0.06 |
| N | 0.51 ± 0.16 | 0.19 ± 0.08 |
| O | 5.25 ± 0.51 | 2.89 ± 0.29 |

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than or equal to 10% of, within less than or equal to 5% of, within less than or equal to 1% of, within less than or equal to 0.1% of, and within less than or equal to 0.01% of the stated amount. If the stated amount is 0 (e.g., none, having no), the above recited ranges can be specific ranges, and not within a particular % of the value. For example, within less than or equal to 10 wt./vol. % of, within less than or equal to 5 wt./vol. % of, within less than or equal to 1 wt./vol. % of, within less than or equal to 0.1 wt./vol. % of, and within less than or equal to 0.01 wt./vol. % of the stated amount.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A process for forming a thin film comprising gold on a substrate in a reaction space, the process comprising:
   sequentially contacting the substrate with a vapor phase gold precursor and a vapor phase second reactant;
   wherein the vapor phase gold precursor comprises sulfur; and
   wherein the gold precursor and the second reactant react to form the thin film comprising gold.

2. The process of claim 1, wherein sequentially contacting the substrate with a vapor phase gold precursor and a vapor phase second reactant comprises a deposition cycle that is repeated two or more times.

3. The process of claim 2, wherein the deposition cycle further comprises removing excess vapor phase gold precursor from the reaction space after contacting the substrate with the vapor phase gold precursor and prior to contacting the substrate with the vapor phase second reactant.

4. The process of claim 2, wherein the deposition cycle further comprises removing excess second reactant and reaction byproducts, if any, from the reaction space after contacting the substrate with the second reactant.

5. The process of claim 2, wherein the process is an atomic layer deposition (ALD) process.

6. The process of claim 2, wherein the process is a cyclical chemical vapor deposition (CVD) process.

7. The process of claim 2, wherein the thin film comprising gold is deposited at a growth rate of more than about 0.8 Å per deposition cycle.

8. The process of claim 2, wherein the thin film comprising gold is continuous after 100 deposition cycles.

9. The process of claim 1, wherein the gold of the gold precursor has an oxidation state of +III.

10. The process of claim 1, wherein the vapor phase gold precursor comprises at least one alkyl ligand.

11. The process of claim 1, wherein the gold precursor comprises one or more neutral adducts.

12. The process of claim 1, wherein the gold precursor comprises a diethyldithiocarbamato ligand.

13. The process of claim 12, wherein the gold precursor comprises $Me_2Au(S_2CNEt_2)$.

14. The process of claim 1, wherein the vapor phase second reactant comprises oxygen.

15. The process of claim 14, wherein the vapor phase second reactant comprises a reactive species of oxygen.

16. The process of claim 15, wherein the vapor phase second reactant comprises ozone.

17. The process of claim 1, wherein the process is carried out at a deposition temperature of from about 120° C. to about 220° C.

18. The process of claim 1, wherein the thin film comprising gold having a thickness of from about 20 nm to about 50 nm is deposited.

19. The process of claim 16, wherein the thin film comprising gold is continuous.

20. The process of claim 1, wherein the thin film comprising gold has a resistivity of less than about 20 μΩcm.

* * * * *